(12) United States Patent
Maldonado et al.

(10) Patent No.: US 9,388,498 B2
(45) Date of Patent: Jul. 12, 2016

(54) ELECTROCHEMICAL LIQUID-LIQUID-SOLID DEPOSITION PROCESSES FOR PRODUCTION OF GROUP IV SEMICONDUCTOR MATERIALS

(75) Inventors: Stephen Maldonado, Ann Arbor, MI (US); Azhar Carim, Farmington Hills, MI (US)

(73) Assignee: The Regents Of The University Of Michigan, Ann Arbor, MI (US)

( * ) Notice: Subject to any disclaimer, the term of this patent is extended or adjusted under 35 U.S.C. 154(b) by 199 days.

(21) Appl. No.: 14/234,084

(22) PCT Filed: Jul. 20, 2012

(86) PCT No.: PCT/US2012/047666
§ 371 (c)(1),
(2), (4) Date: Jan. 21, 2014

(87) PCT Pub. No.: WO2013/016215
PCT Pub. Date: Jan. 31, 2013

(65) Prior Publication Data
US 2014/0190837 A1    Jul. 10, 2014

Related U.S. Application Data

(60) Provisional application No. 61/510,813, filed on Jul. 22, 2011.

(51) Int. Cl.
*C25B 1/00* (2006.01)
*C25C 1/22* (2006.01)
*H01L 21/02* (2006.01)
(Continued)

(52) U.S. Cl.
CPC . *C25B 1/006* (2013.01); *C25C 1/22* (2013.01); *C30B 7/12* (2013.01); *C30B 29/06* (2013.01); *C30B 29/08* (2013.01); *C30B 29/52* (2013.01); *H01L 21/02425* (2013.01); *H01L 21/02532* (2013.01); *H01L 21/02603* (2013.01);
(Continued)

(58) Field of Classification Search
CPC .................................. C25B 1/006; C25C 1/22
See application file for complete search history.

(56) References Cited

U.S. PATENT DOCUMENTS

| 3,573,967 | A | 4/1971 | Pfann et al. |
| 2007/0275160 | A1 | 11/2007 | Maldonado et al. |
| 2010/0276297 | A1 | 11/2010 | Powell, IV et al. |

OTHER PUBLICATIONS

Liang et al, "Growth of Ge Nanofilms Using Electrochemical Atomic Layer Deposition, with a "Bait and Switch" Surface-Limited Reaction" J. Am. Chem. Soc. 2011, 133, 8199-8204.*

(Continued)

*Primary Examiner* — Keith Hendricks
*Assistant Examiner* — Salil Jain
(74) *Attorney, Agent, or Firm* — Harness, Dickey & Pierce, PLC

(57) ABSTRACT

An electrochemical liquid-liquid-solid (LLS) process that produces unlimited amounts of crystalline semiconductor, such as Ge or Si, from aqueous or polar solutions with tunable nanostructured shapes without any physical or chemical templating agent is presented. Dissolution into, saturation within, and precipitation of the semiconductor from a liquid electrode (e.g., Hg pool) or near an electrode comprising metallic nanoparticles (e.g., In nanoparticles) yields a polycrystalline semiconductor material, as deposited. Such a process can be conducted at conditions, in a single step, and under electrochemical control, while affording control over formation of a variety of material morphologies. Materials formed by such processes are also provided.

19 Claims, 15 Drawing Sheets

(51) Int. Cl.
  *C30B 7/12* (2006.01)
  *C30B 29/06* (2006.01)
  *C30B 29/08* (2006.01)
  *C30B 29/52* (2006.01)
(52) U.S. Cl.
  CPC .... *H01L21/02628* (2013.01); *H01L 21/02645* (2013.01); *H01L 21/02653* (2013.01)

(56) References Cited

OTHER PUBLICATIONS

Carim, Azhar I., et al., "Benchtop Electrochemical Liquid-Liquid-Solid Growth of Nanostructured Crystalline Germanium," J. Am. Chem. Soc., vol. 133, pp. 13292-13295 (2011) (published online Aug. 10, 2011) and Supporting Information (pp. S1-S17).

Chockla, Aaron M., et al., "Colloidal Synthesis of Germanium Nanorods," Chem. Mater., vol. 23, pp. 1964-1970 (Mar. 3, 2011).

Fink, Colin G., et al., "Electrodeposition and Electrowinning of Germanium," Journal of the Electrochemical Society, vol. 95, No. 2, 1949, pp. 80-97, see Section 1.

Figure 1:
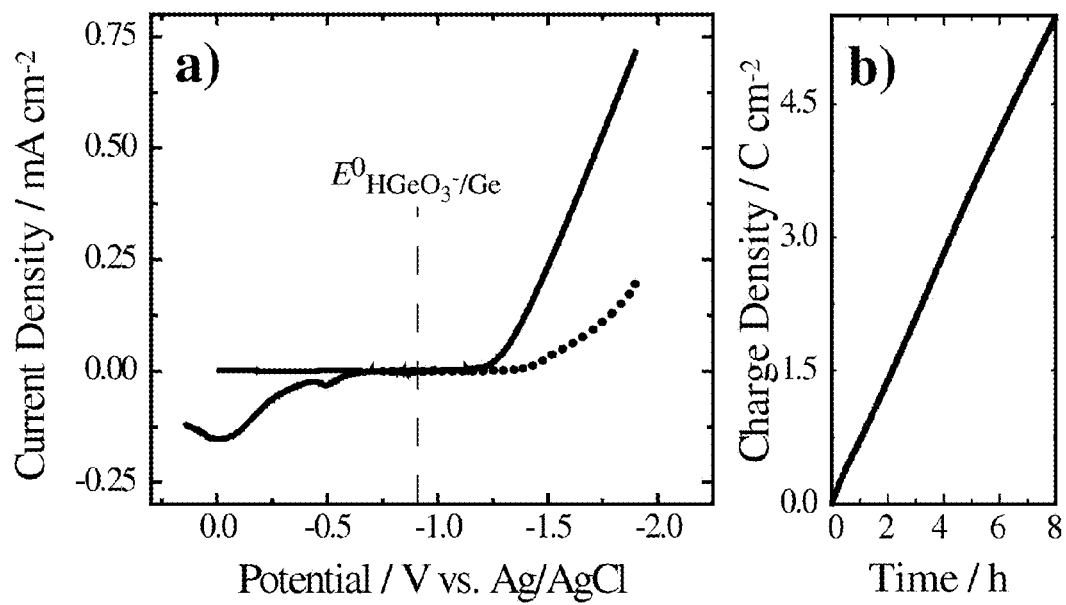
Figure 1:
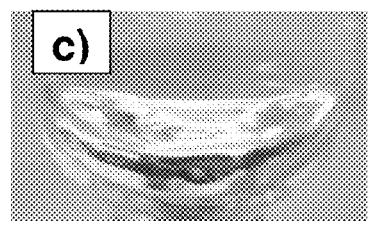
Figure 1:
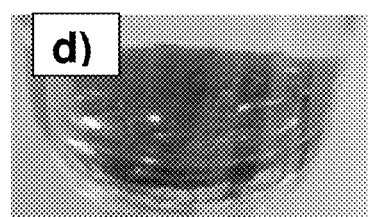
Figure 2:
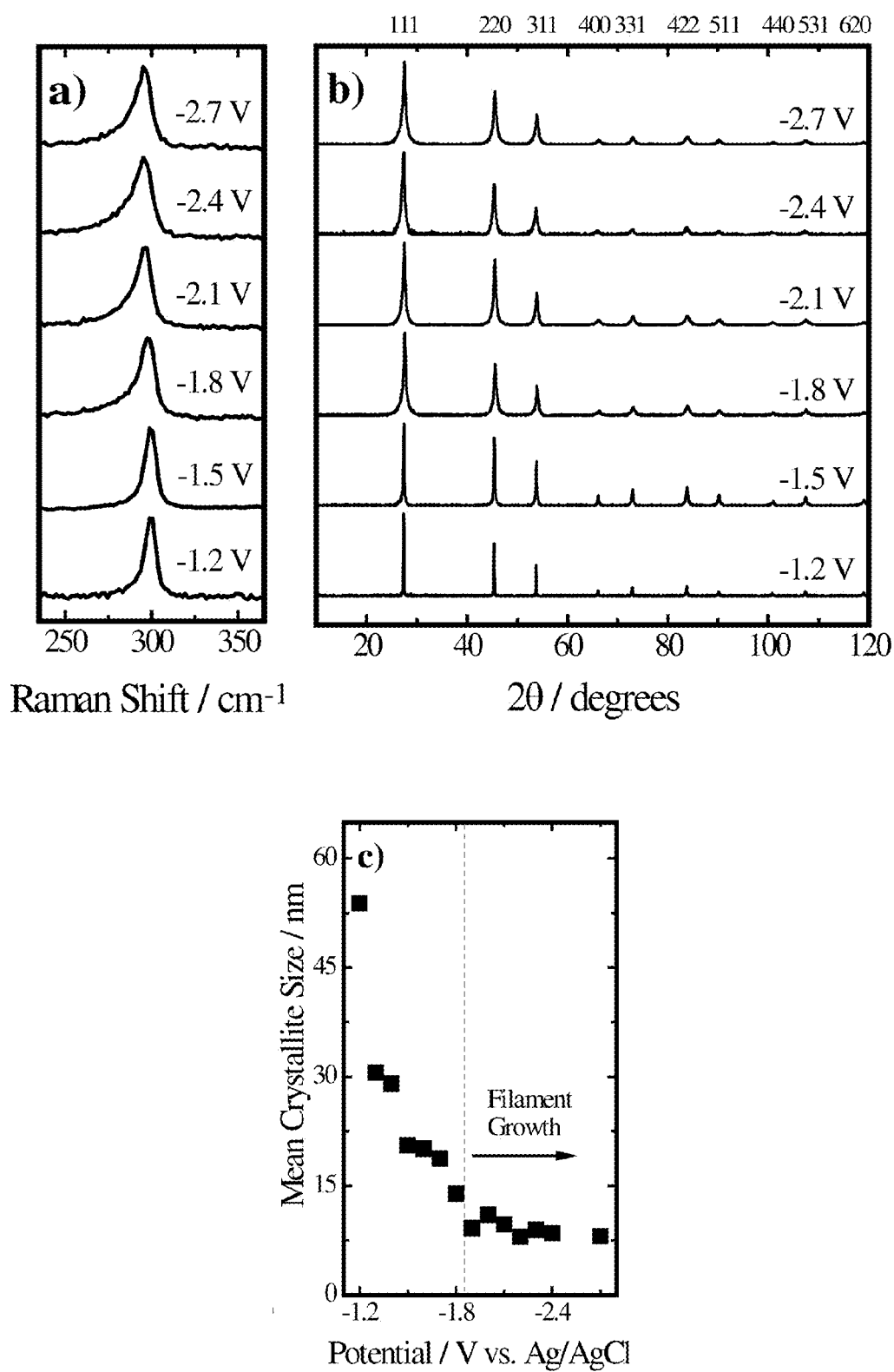

Flowers, Billy H., Jr., et al., "Atomic layer epitaxy of CdTe using an automated electrochemical thin-layer flow deposition reactor," Journal of Electroanalytical Chemistry, vol. 524-525, 2002, pp. 273-285. See section 2; and figures 1, 2.

Gobet, J., et al., "Electrodeposition of Silicon from a Nonaqueous Solvent," Journal of the Electrochemical Society, vol. 135, No. 1, 1988, pp. 109-112. See Experimental.

Gu, Junsi, et al., "Template-Free Preparation of Crystalline Ge Nanowire Film Electrodes via an Electrochemical Liquid-Liquid-Solid Process in Water at Ambient Pressure and Temperature for Energy Storage," Nano Letters, vol. 12, pp. 4617-4623 (Aug. 17, 2012) and Supporting Information (11 pages).

Figure 8:
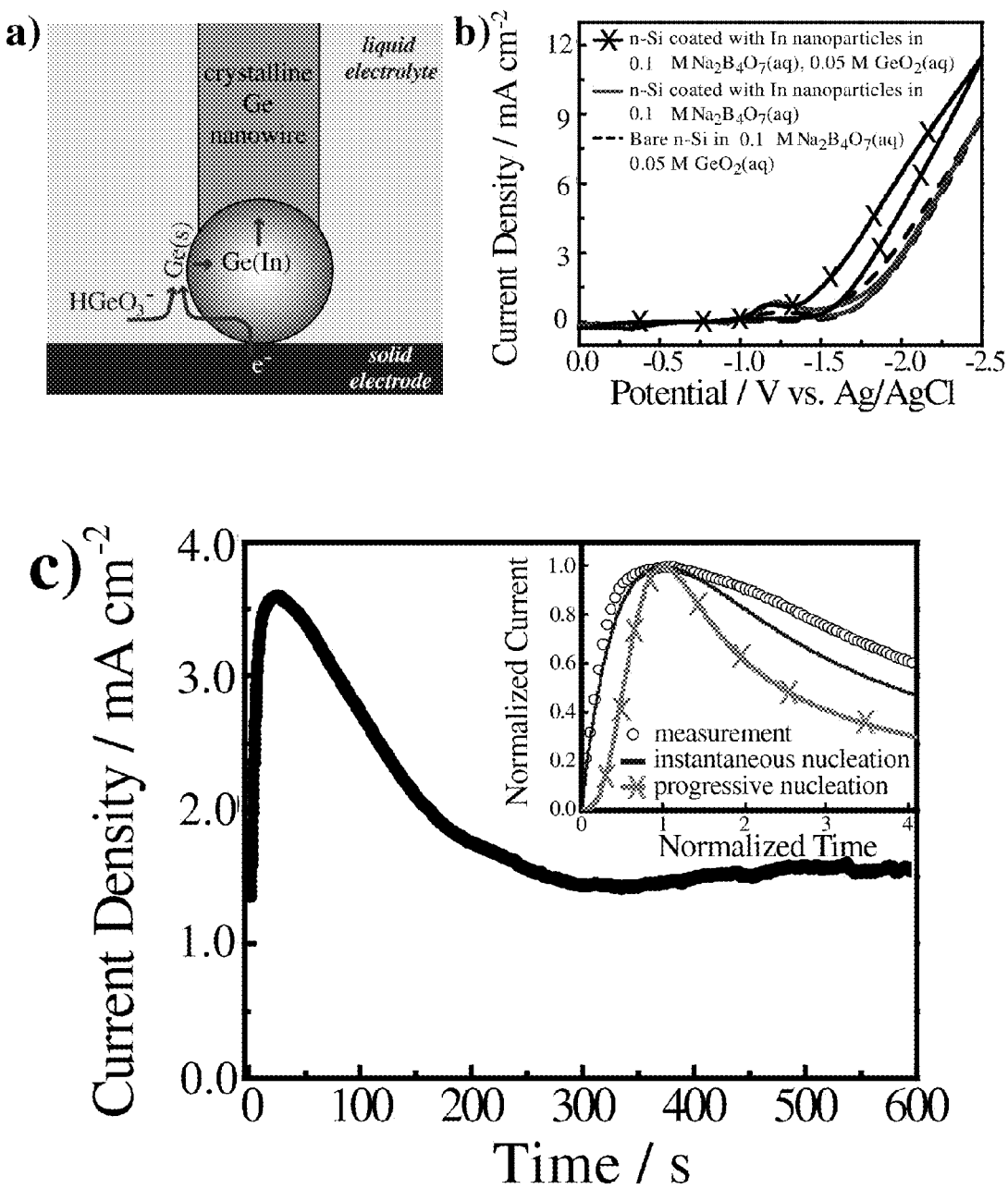

Liang, Xuehai, et al., "Growth of Ge Nanofilms Using Electrochemical Atomic Layer Deposition, with a 'Bait-and-Switch' Surface-Limited Reaction," Journal of the American Chemical Society, vol. 133, May 3, 2011, pp. 8199-8204. See experimental section p. 8203, col. 1, lines 2-10; and see figure 8.

International Search Report and Written Opinion of the ISA for PCT/US2012/047666, ISA/KR, Seo-gu, Daejeon, mailed Jan. 29, 2013.

* cited by examiner

ELECTROCHEMICAL LIQUID-LIQUID-SOLID DEPOSITION PROCESSES FOR PRODUCTION OF GROUP IV SEMICONDUCTOR MATERIALS

This application is a 371 National Phase of PCT/US 2012/047666 filed Jul. 20, 2012, which claims the benefit of U.S. Provisional Application No. 61/510,813, filed on Jul. 22, 2011. The entire disclosures of the above applications are incorporated herein by reference.

FIELD

The present disclosure relates to methods for electrochemical liquid-liquid-solid growth of Group IV semiconductor materials, including formation of nanostructured crystalline germanium, silicon, or combinations thereof.

BACKGROUND

This section provides background information related to the present disclosure which is not necessarily prior art.

Conventional techniques for forming crystalline semiconductors are energy intensive, take long periods for processing, and can be quite expensive. For example, conventional processing methods often involve crystallizing an amorphous semiconductor material, such as an amorphous silicon layer, by heat or laser annealing to generate the desired crystallinity. Further, in certain other methods of forming crystalline semiconductor materials, in order to provide the desired morphology for the crystalline material, complex physical and/or chemical templating agents are used. Hence, improved methods for forming crystalline semiconductor materials that are faster, less expensive, and less energy intensive, while having streamlined control over morphology would be desirable.

SUMMARY

In accordance with certain aspects of the present disclosure, methods are provided to form materials that comprise a semiconductor element (e.g., an element found in Group IV of the Periodic Table), including crystalline materials comprising the semiconductor element. In certain aspects, a material that comprises a semiconductor element is formed by first contacting a liquid electrolyte with a first electrode. The first electrode is in electrical communication with a second electrode having a second opposite polarity from the first electrode, so that an electrolytic process is conducted. The electrolyte can be formed by combining water and an oxide compound of a semiconductor element.

The methods of the present teachings include, in certain aspects, generating a precipitated solid material comprising the semiconductor element. The precipitated solid material is then generated by applying an electric potential to the first electrode (e.g., a cathode) in contact with a liquid electrolyte to drive an electrochemical reduction reaction that forms a solid material comprising the semiconductor element, for example by precipitating the semiconductor element out of solution at or within the first electrode. Such an electrochemical liquid-liquid-solid (LLS) process provided in accordance with the present teachings provides the capability to generate unlimited amounts of crystalline or alternatively amorphous semiconductor materials (having predetermined morphologies), while desirably avoiding any need for physical or chemical templating agents, among other advantages.

Thus, in certain aspects, the present teachings provide a method that comprises contacting a liquid electrolyte with a first electrode, wherein the first electrode is in electrical communication with a second electrode having a second opposite polarity from the first electrode. The electrolyte can be formed by combining water and an oxide compound of a semiconductor element optionally selected from the group consisting of: silicon, germanium, or combinations thereof. A precipitated solid material comprising the semiconductor element is generated by applying an electric potential to the first electrode in contact with the electrolyte to drive an electrochemical reduction reaction that forms a solid material comprising the semiconductor element by precipitation out of solution at or within the first electrode.

In certain other variations, methods are provided for forming a crystalline material that comprises contacting a liquid electrolyte with a first liquid electrode, wherein the first liquid electrode is in electrical communication with a second electrode having a second opposite polarity from the first electrode. The electrolyte can be formed by combining water and an oxide compound comprising a Group IV semiconductor element. The first liquid electrode comprises a metal selected from the group consisting of: mercury, gallium, indium, zinc, cadmium, combinations and alloys thereof. The method comprises generating a crystalline material comprising the Group IV semiconductor element by applying an electric potential to the first liquid electrode in contact with the liquid electrolyte to drive an electrochemical reduction reaction that generates the crystalline material comprising the Group IV semiconductor element by precipitation at or within the first liquid electrode.

In yet other aspects, a polycrystalline material is provided by the present teachings. For example, in certain variations, the polycrystalline material comprises a precipitated solid comprising a semiconductor element selected from the group consisting of: silicon, germanium, or combinations thereof having randomly oriented crystal domains. An average crystal domain size is optionally greater than or equal to about 5 nm.

Further aspects of the inventive technology and further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIGS. 1a-1d. FIG. 1a shows voltammetric responses for the electroreduction of concentrated germanium oxide ($GeO_2$ (aq)) solutions at large overpotentials that favor the rapid synthesis of bulk amounts of semiconductor Ge in accordance with certain aspects of the present teachings. FIG. 1b reflects chronocoulometric experiments conducted on the timescale of hours showing observed Ge reduction process is stable and not fouled by $H_2$ evolution. FIGS. 1c and 1d contrast the appearance of an electrode interface (liquid Hg) before and after electrodeposition biased at −1.9 V vs. Ag/AgCl for 20 min.

FIGS. 2a-2c. FIG. 2a reflects first order Raman spectra analysis of Ge electrodepositions formed in accordance with certain aspects of the present teachings at several constant applied biases, which exhibit a single strong signature near 300 cm$^{-1}$ indicating presence of crystalline Ge(s). FIG. 2b are separate powder X-ray diffractograms of the electrodeposited Ge with the same constant applied biases of FIG. 2a, exhibiting reflection patterns consistent a diamond cubic lattice and lacking any crystalline, solid Ge—Hg alloy. FIG. 2c is a Rietveld-type analysis of the XRD patterns in FIG. 2b, showing average crystalline domain sizes for Ge electrodeposited at electric potentials between −1.2 and −2.7 V vs. Ag/AgCl.

Figure 3:
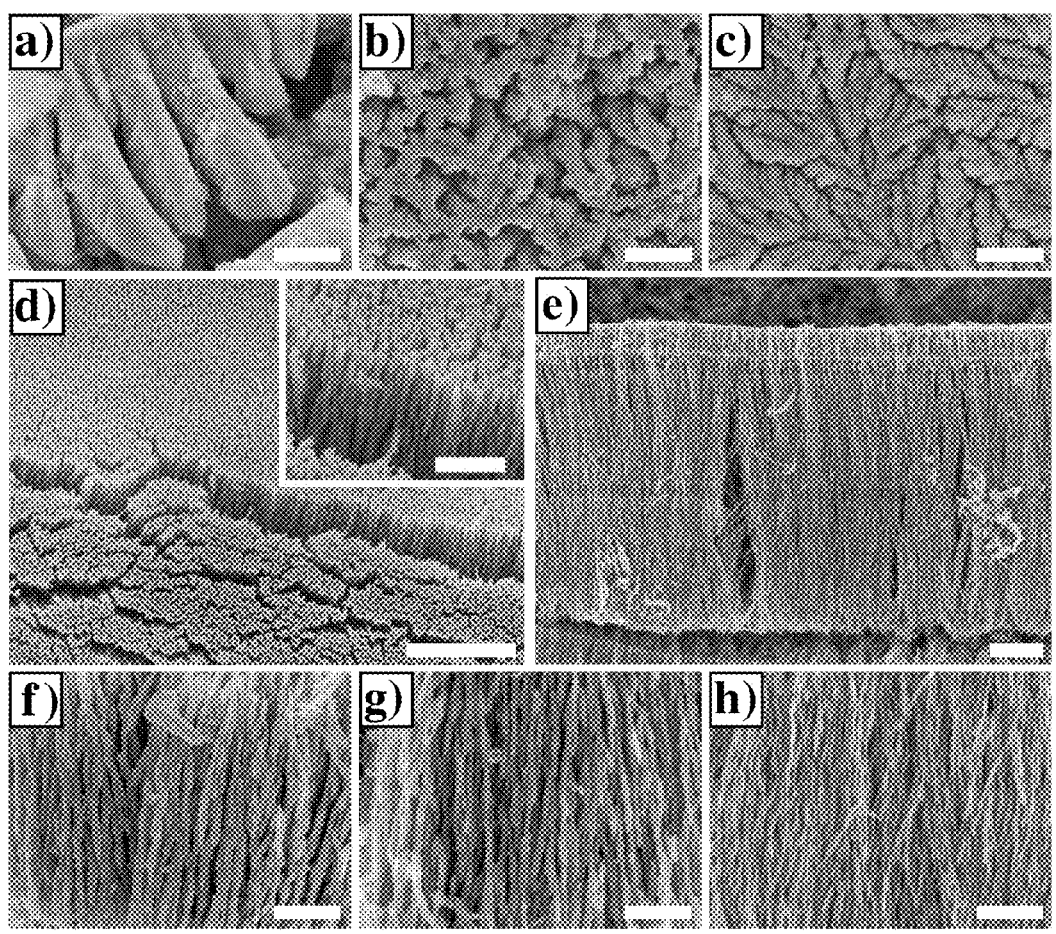

FIGS. 3a-3h. Representative scanning electron micrographs (SEM) are shown in FIGS. 3a-3h. Innate morphologies of Ge electrodeposited in accordance with certain aspects of the present teachings at respective electrode potentials (E) of −1.2 V, −1.5 V, and −1.8 V vs. Ag/AgCl are shown in FIGS. 3a-c. FIG. 3d illustrates three-dimensional mats of vertically aligned Ge filaments observed for films prepared at E=−2.7 V vs. Ag/AgCl. The inset of FIG. 3d highlights the individual filament tips at the bottom of each film section. FIG. 3e highlights a side-view of these films to illustrate the high density, uniformity, and length of the Ge filaments. The average diameter of the as-collected Ge filaments is a function of the bias used for electrodeposition, with averaged diameters for the filaments shown in FIGS. 3f-h of 53±16 nm, 45±14 nm, and 26±9 nm.

Figure 4:
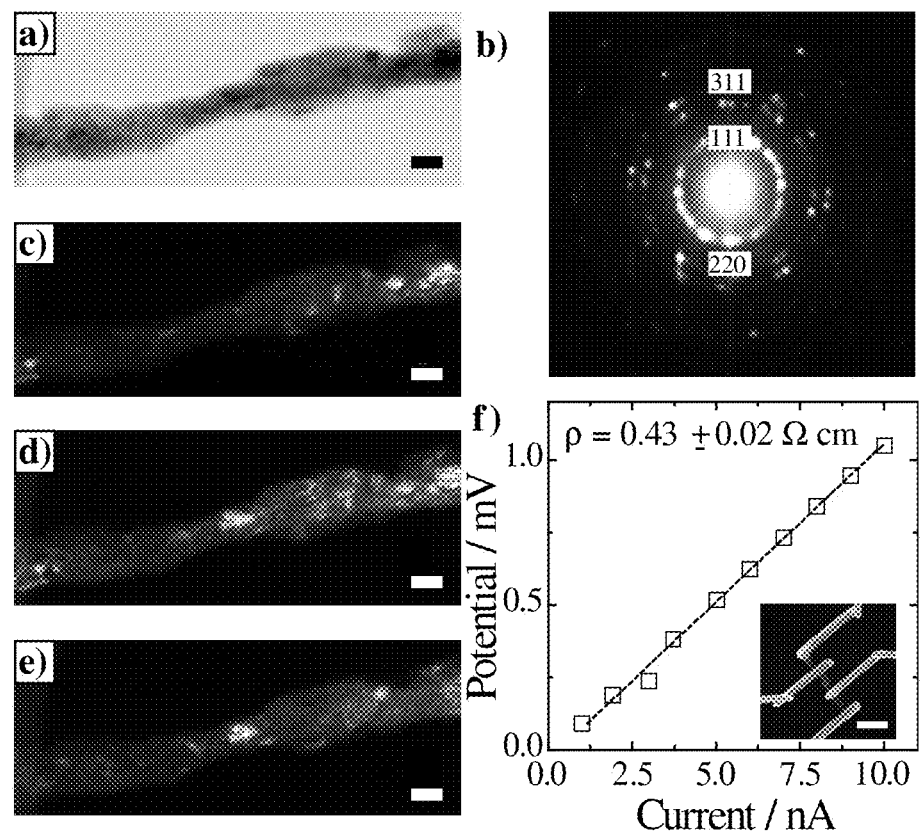

FIGS. 4a-4f. FIG. 4a highlights a bright field transmission electron micrograph (TEM) of a representative Ge filament prepared in accordance with certain aspects of the present teachings via electrodeposition at an electrode potential (E) of −2.7 V vs. Ag/AgCl. A selected area electron diffraction pattern collected for the same isolated filament in FIG. 4a is shown in FIG. 4b. FIGS. 4c-4e illustrate dark field diffraction contrast transmission electron micrographs collected with distinct (220) diffracted electron beams to form each respective image. FIG. 4f displays the observed current/potential response for a 4 point probe device of electrodeposited Ge filaments formed in accordance with certain aspects of the present teachings.

Figure 5:
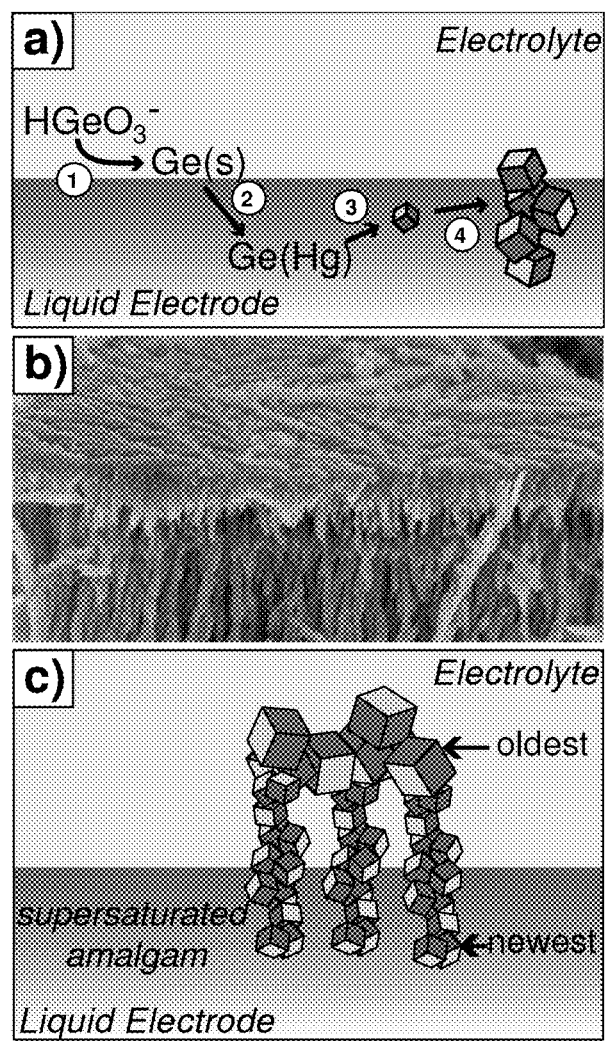

FIGS. 5a-5c. FIGS. 5a and 5c are schematics showing a three-part electrodeposition mechanism at an interface between a liquid electrolyte and a liquid electrode showing vertical growth of precipitated cube-shaped semiconductor material from the liquid electrode into the electrolyte according to certain aspects of the present teachings. FIG. 5b shows electron micrographs indicating tops of the Ge filament films have leaf-like morphologies similar to that shown in FIG. 3c, so that discrete thin filaments emanate from the underside of this top layer, which suggests Ge filament formation occurs as illustrated in FIG. 5c.

Figure 6:
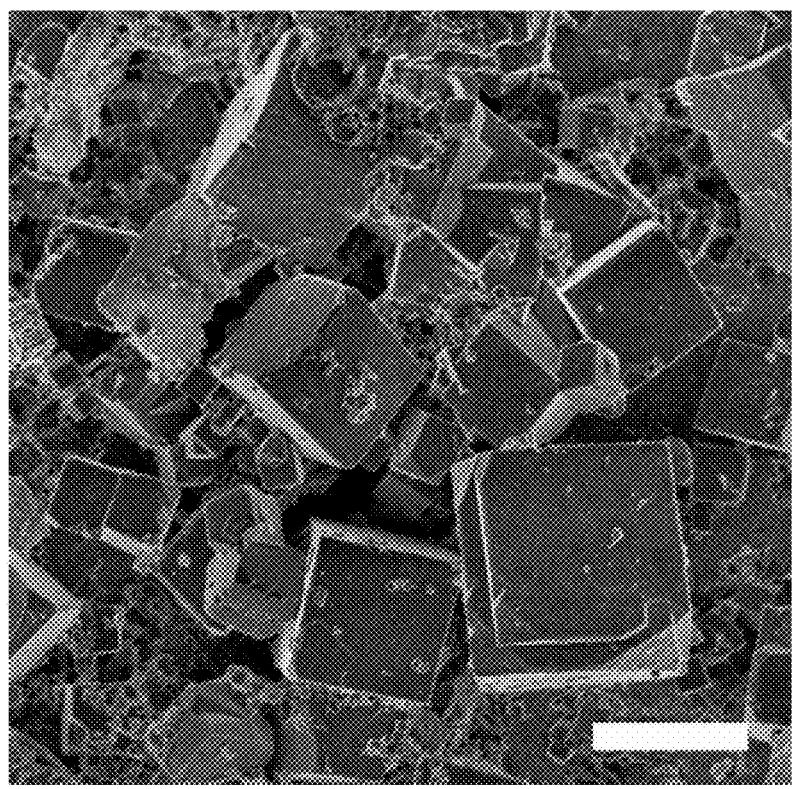

FIG. 6 shows a scanning electron micrograph (scale bar=10 μm) of solid electrodeposited germanium Ge(s) comprising cube-shaped particles, observed during pulsed electrodeposition at a liquid Hg electrode in 50 mM $GeO_2$(aq) with 10 mM $Na_2B_4O_7$.

Figure 7:
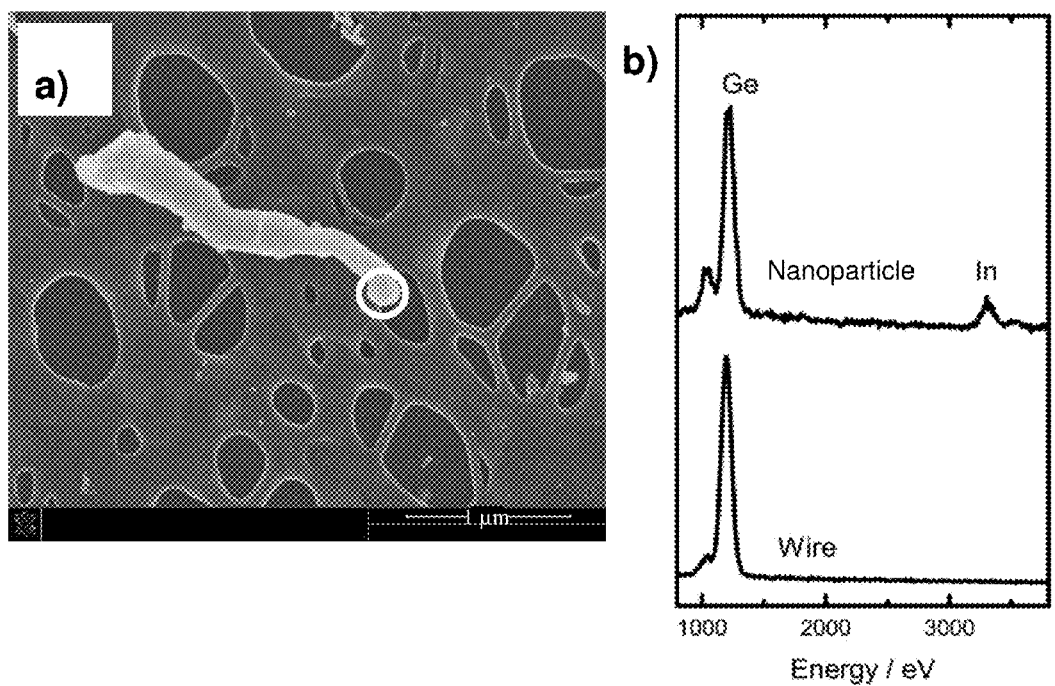

FIGS. 7a-7d. FIG. 7a shows a scanning electron micrograph (scale bar=1 μm) of a solid filament formed from electrodeposited germanium Ge(s) on an indium (In) nano-particle electrode (shown in the circle). FIG. 7b shows energy dispersive X-ray spectra indicating that the nanoparticle at the tip of the filament comprises In, but that the body of the filament contains no detectable level of In. FIG. 7c shows phase contrast transmission electron micrographs of Ge filaments electrodeposited onto the indium nano-particle. FIG. 7d shows a selected area electron diffraction pattern collected for the same isolated filament in FIG. 7a, where the ring pattern confirms a crystalline diamond lattice structure of the Ge filament.

FIGS. 8a-8c. FIG. 8a shows a schematic depiction of a process for an electrochemical liquid-liquid-solid (ec-LLS) semiconductor crystal growth according to certain aspects of the present disclosure that forms germanium (Ge) nanowire by electrodeposition at an indium (In) nanoparticle "flux" electrode on an inert conductive substrate. FIG. 8b shows current-potential responses for n-Si electrodes immersed in 0.01 M $Na_2B_4O_7$(aq). Responses are shown for (dashed line) bare n-Si electrodes in electrolyte +0.05 M $GeO_2$(aq), (solid red line) n-Si electrodes decorated with In nanoparticles in electrolyte without 0.05 M $GeO_2$(aq), and (solid black line) n-Si electrodes decorated with In nanoparticles in electrolyte with 0.05 M $GeO_2$(aq). Scan rate=0.025 V s$^{-1}$. FIG. 8c shows corrected current-time response for n-Si electrode coated with In nanoparticles, immersed in 0.01 M $Na_2B_4O_7$(aq) and 0.05 M $GeO_2$(aq), and biased at −2.0V vs. Ag/AgCl for 10 min. Inset: Same data with current normalized to the peak current density and time normalized to the time corresponding to the peak current density. Models for (blue line) instantaneous and (green line) progressive nucleation models are also shown.

Figure 9:
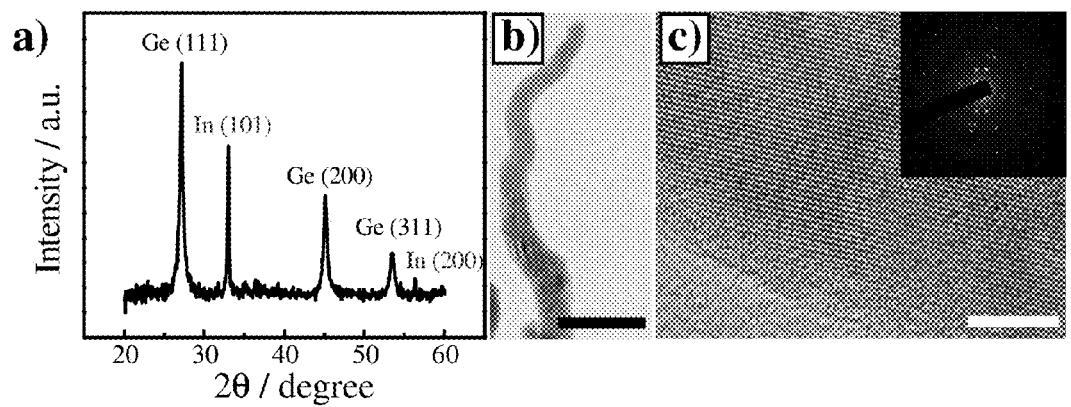
Figure 10:
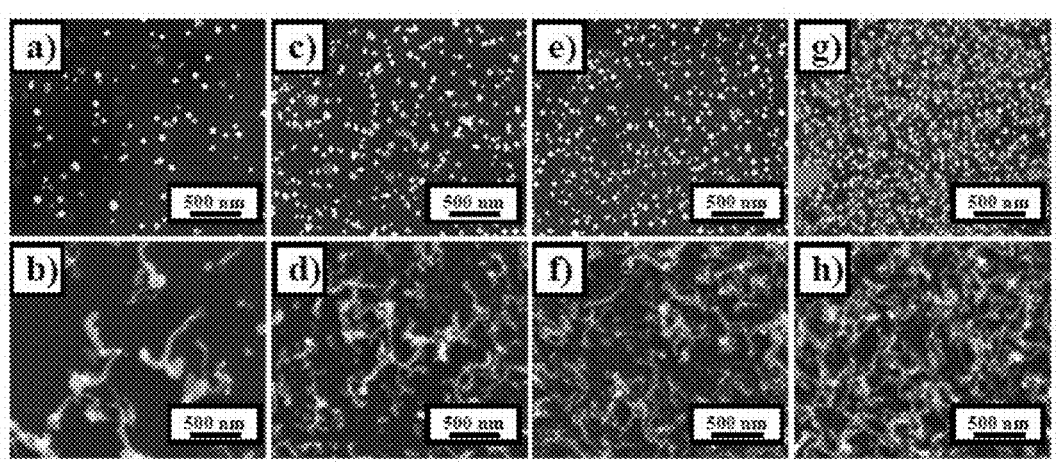

FIGS. 9a-9c. FIG. 9a shows measured X-ray diffraction pattern collected after Ge electrodeposition at −2.0 V vs. Ag/AgCl for 1 hour. FIG. 9b shows low resolution transmission electron micrographs of an individual Ge nanowire electrodeposited at −2.0 V vs. Ag/AgCl for 10 min. Scale bar: 50 nm. FIG. 9c shows high resolution transmission electron micrograph of same Ge nanowire as in FIG. 9b. Scale bar: 5 nm. Inset: electron backscatter diffraction pattern indicating a diamond-like crystal lattice with a 3.29 Å lattice constant.

FIGS. 10a-10h. Top-down view scanning electron micrographs of n-Si electrodes decorated with different densities of In nanoparticles before and after (FIGS. 10a and 10b; 10c and 10d; 10e and 10f; 10g and 10h) Ge electrodeposition at −2.0 V vs. Ag/AgCl for 10 min.

Figure 11:
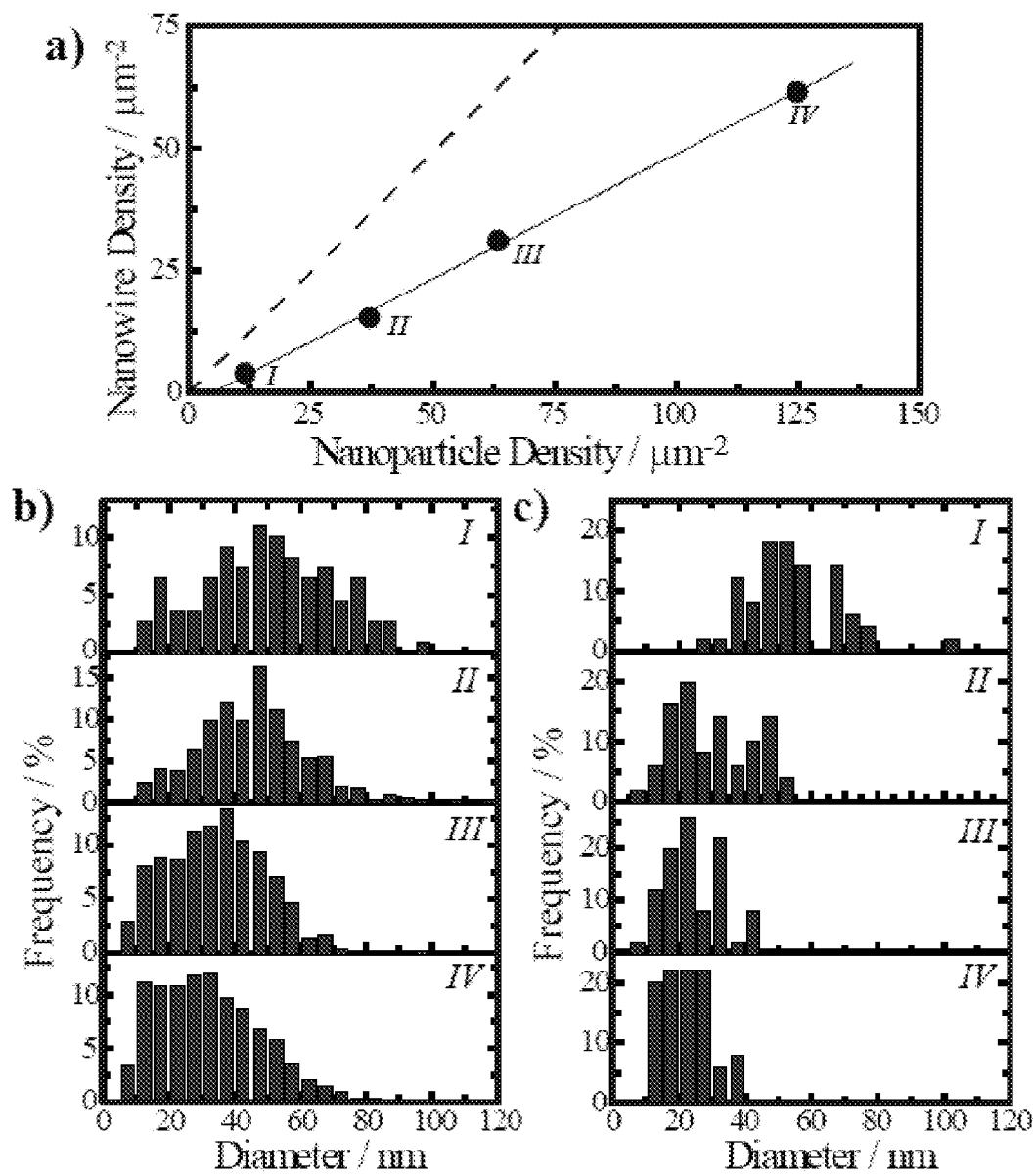

FIGS. 11a-11c. FIG. 11a is a comparison of the observed density of Ge nanowires as a function of the observed density of In nanoparticles on n-Si electrodes. The dashed line corresponds to 1 Ge nanowire per 1 In nanoparticle. FIG. 11b shows observed size distribution of In nanoparticles at several different In nanoparticle densities, as indicated in FIG. 11a. FIG. 11c shows size distribution of Ge nanowires electrodeposited from In nanoparticles at the four different densities of In nanoparticles shown in FIG. 11b. Bin sizes in FIGS. 11b and 11c are 5 nm.

Figure 12:
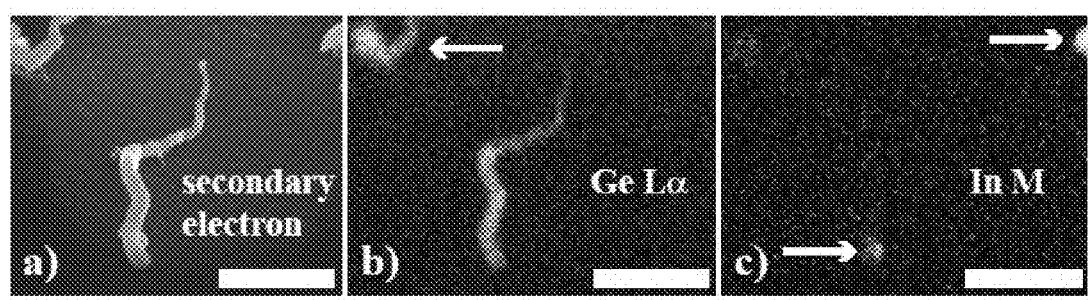

FIGS. 12a-12c. FIG. 12a is a secondary electron scanning electron micrograph of an individual Ge nanowire electrodeposited at −2.0 V vs. Ag/AgCl for 10 min. FIGS. 12b and c are energy dispersive spectroscopic elemental mapping of same area in FIG. 12a with the detector set at FIG. 12b the Lα line for Ge or FIG. 12c the M line for In. Images were collected with the sample tilted at 45°. Scale bars: 500 nm. Arrows highlight features of interest as discussed in the text.

Figure 13:
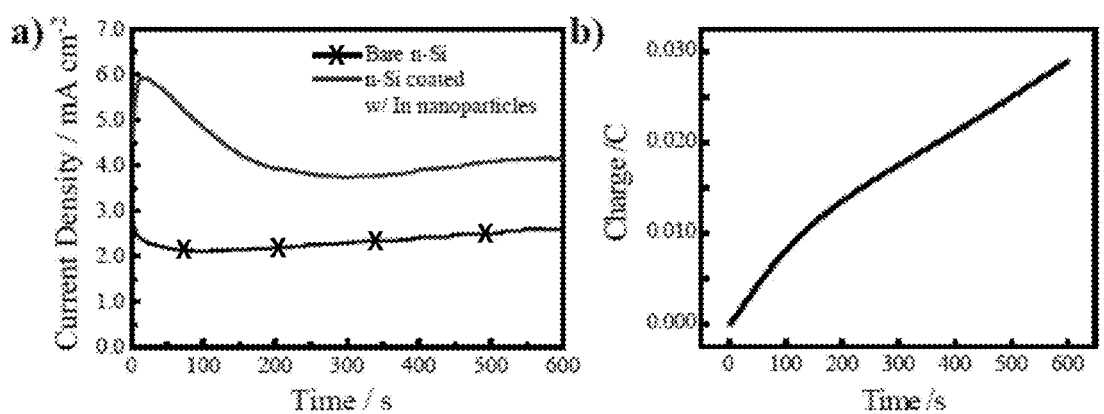

FIGS. 13a-13b. FIG. 13a shows raw (uncorrected) chronoamperometric responses for (black line) a bare n-Si electrode and (red line) an n-Si electrode coated with In nanoparticles in 0.01 M $Na_2B_4O_7$ and 0.05 M $GeO_2$ biased at −2.0V vs. Ag/AgCl for 10 min. FIG. 13b shows chronocoulometric response for an n-Si electrode coated with In nanoparticles biased at −2.0V vs. Ag/AgCl for 10 min while immersed in 0.01 M $Na_2B_4O_7$(aq) and 0.05 M $GeO_2$(aq) after subtraction of the background faradaic charge for $H^+$ reduction.

Figure 14:
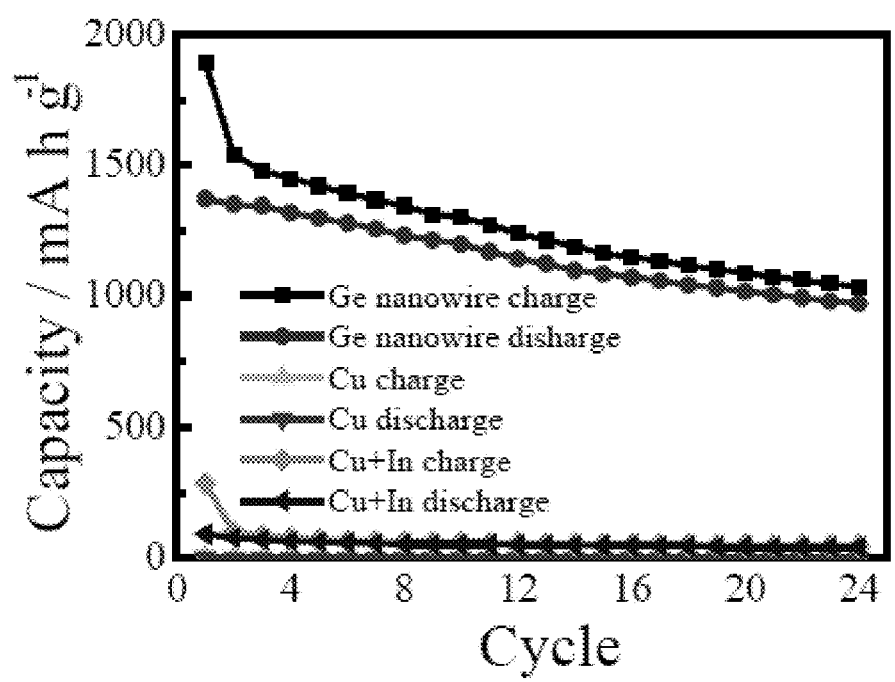

FIG. 14 shows representative capacity cycling responses for Ge nanowire film electrodes (electrodeposited at −2.0 V vs. Ag/AgCl for 10 min in 0.01 M $Na_2B_4O_7$(aq) and 0.05 M $GeO_2$(aq)), Cu electrodes coated with In nanoparticles (electrodeposited at −2.0 V vs. Ag/AgCl for 30 sec in 0.1 M $InBr_3$(aq) and 0.1 M $KNO_3$(aq)), and bare Cu electrodes for purposes of comparison.

Figure 15:
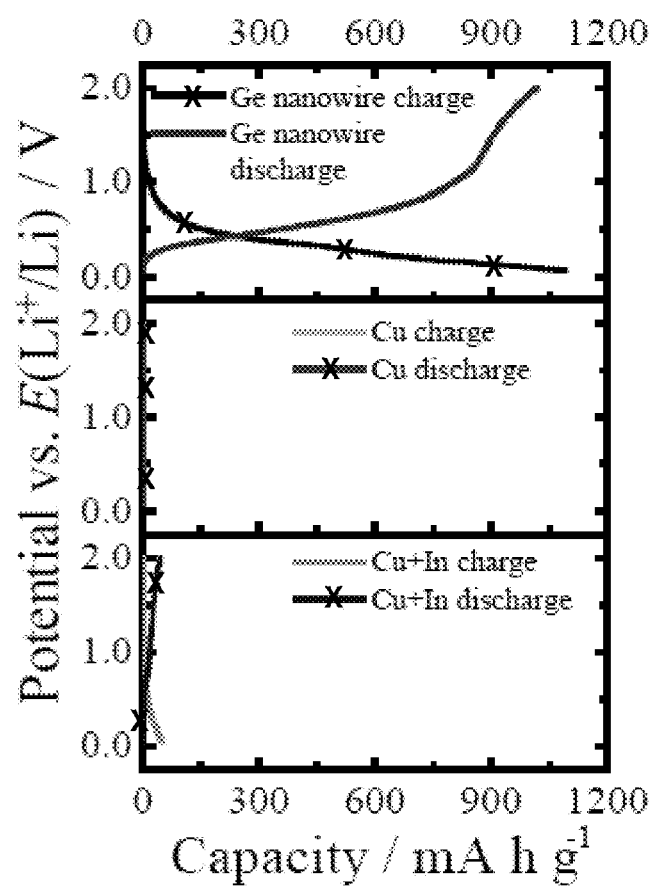

FIG. 15 shows representative potential-capacity curves for the 20th cycle for Ge nanowire film electrodes, Cu electrodes coated with In nanoparticles, and bare Cu electrodes.

Corresponding reference numerals indicate corresponding parts throughout the several views of the drawings.

DETAILED DESCRIPTION

Example embodiments will now be described more fully with reference to the accompanying drawings.

In various aspects, the present disclosure pertains to methods of forming materials that comprise a Group IV semiconductor element. A "semiconductor" may refer to any material that is an insulator at relatively low temperatures, but has an appreciable electrical conductivity at relatively high temperatures, for example, around room temperature. Semiconductors useful in the context of the present teachings optionally comprise elements of Group IV of the Periodic Table, for example, silicon, germanium, carbon (e.g., diamond), tin, as well as alloys or compounds thereof. For example, compound semiconductors including Group IV semiconductor elements may include SiC and SiGe. Such semiconductor materials find wide applicability in a variety of fields and applications, including those in the microelectronics, opto-electronic devices, energy conversion devices, like electrochemical cells, batteries, thermoelectric devices, and the like, by way of non-limiting example.

In various aspects, scalable, non-energy intensive, and environmentally benign methods are provided for producing crystalline, nanostructured semiconductor materials. Such techniques are useful for next generation energy conversion/storage technologies, by way of non-limiting example. To this end, the inventive technology provides assembly strategies that do not rely on existing semiconductor industry multi-step fabrication practices, but instead yield fully functional nano-material-based devices in a single preparative step. Such methods involve electrochemically synthesizing crystalline semiconductor structures by using liquid electrolytes, such as aqueous or other polar solvents capable of dissolving semiconductor oxides, in contact with an electrode, which may comprise a metallic liquid flux electrode or one or more metallic nanoparticles. The electrode can act as a traditional electrode platform for electrodeposition, as well as a solvent for crystallization. By such principles, the semiconductor can be initially electrodeposited as a fully reduced material, which is then dissolved within the flux electrode. If the electrodeposition continues, the alloy eventually reaches saturation, followed by crystalline semiconductor precipitation out of the flux electrode. The crystallinity and morphology of the deposit is related to the rates of electroreduction, dissolution, crystal nucleation, and precipitation. In this way, methods of the present teachings combine elements of more familiar semiconductor nanowire preparative techniques such as vapor-liquid-solid (VLS) and solution liquid-solid (SLS) growths with traditional metal flux crystallizations, with complete electrochemical control (thus the inventive techniques are also referred to as an electrochemical liquid-liquid-solid (ec-LLS) semiconductor crystal growth).

Hence, in certain aspects, the present disclosure provides a method for forming a material that comprises a semiconductor element by first contacting a liquid electrolyte with a first electrode. The liquid electrolyte may be an aqueous electrolyte comprising water and/or may contain another polar solvent capable of dissolving a semiconductor oxide. The first electrode is in electrical communication with a second electrode having a second opposite polarity from the first electrode, so that an electrolytic process is conducted. Electrochemical devices having an oxidizable active anode material, a reducible cathode material, and a liquid electrolytic solution between and in contact with the anode and the cathode are well known for conducting electrochemical processes. Often, such electrochemical processes and devices have half-reactions or half-cells separating the first electrode (either anode or cathode) and a first electrolyte from the second electrode (the other of the cathode and anode) and a second electrolyte. The present teachings contemplate in certain variations forming the material comprising a semiconductor element in a half-cell via a half-reaction, coupled with the complementary other half-cell/reaction.

An aqueous liquid electrolyte can be formed by combining water and an oxide compound of a semiconductor element. In alternative variations, a liquid electrolyte capable of dissolving the oxide is a Group IV semiconductor element can be employed, which comprises one or more polar solvents (aside from water). In certain variations, the semiconductor element forming the oxide is a Group IV semiconductor element as discussed previously above. In certain other aspects, the semiconductor element is more specifically selected from the group consisting of: silicon, germanium, or combinations thereof. In certain variations, the aqueous liquid electrolyte comprises water and the at least one oxide compound of the semiconductor element. In other variations, the electrolyte may comprise one or more polar solvents capable of dissolving a Group IV semiconductor oxide and thus, may optionally comprise dimethyl sulfoxide, dimethylformamide, acetone, acetonitrile, combinations and equivalents thereof, by way of non-limiting example. These polar solvents may be combined with water to form the electrolyte, as well. In certain embodiments, the oxide compound can be germanium oxide ($GeO_2$) and/or silicon dioxide ($SiO_2$) in aqueous solution (or stabilized by surfactants).

In certain variations, the liquid electrolyte is in the form of a solution, including water, optionally one or more polar solvents in addition to or in lieu of water, and one or more oxide compounds. A "solution" as used herein encompasses not only solutions having components (e.g., phases, moieties, solvents, solutes, molecules, and the like) that are homogenously mixed together, but also combinations of components or materials that are not necessarily evenly, homogeneously, or regularly distributed when combined (e.g., unevenly mixed combinations of components, separated layers of immiscible components, unevenly distributed suspensions, and the like). However, in certain preferred aspects, the liquid electrolyte is in the form of a "true" solution having solutes, such as the oxides of the semiconductor element(s), dissolved within the aqueous or polar solvent. The liquid electrolyte may comprise water and optionally may comprise one or more polar solvents capable of dissolving a Group IV semiconductor oxide. Non-limiting examples of such polar solvents include dimethyl sulfoxide, dimethylformamide, acetone, acetonitrile, combinations and equivalents thereof. It should be appreciated that the electrolyte may further comprise other typical additives for an electrolyte system, as are well known in the art, including without limitation buffers. Exemplary buffers include sodium borate ($Na_2B_4O_7$) and/or potassium bicarbonate ($KHCO_3$) used at conventional concentrations, which can be readily determined by those of skill in the art. As described below, the composition of the buffer(s) does not appear to have any effect on the electrochemical reactions or product formed.

The methods of the present teachings may, in various aspects, include generating a precipitated solid material comprising the semiconductor element. The precipitated solid material can be generated by applying an electric potential to the first electrode (e.g., a cathode) in contact with the liquid electrolyte to drive an electrochemical reduction reaction that forms a solid material comprising the semiconductor element by precipitating the semiconductor element out of solution at, near, or within (inside) the first electrode. Furthermore, as will be described below, in certain variations, preferred electrode materials are in a liquid form at the temperatures at which the electrochemical process takes place, for example, less than or equal to about 100° C.

In various aspects, the first electrode comprises a material that is inactive with respect to any parasitic electrochemical reactions in the presence of the semiconductor element in the electrolyte (e.g., avoids parasitic electrolyte decomposition electrochemical reactions, like hydrogen generation in an aqueous electrolyte), so that the electrochemical reduction reaction that forms the solid material comprising the semiconductor element occurs preferentially instead. In certain aspects, the first electrode material is selected so as to have a low solubility and low diffusivity with respect to the semiconductor element, so that under high current densities used for the electroreduction reaction of the semiconductor element, the semiconductor element fluxes into a bulk of the first electrode material, but remains near and saturates near a surface region/interface between the first electrode and surrounding electrolyte.

Accordingly, in certain variations, the first electrode comprises one or more Group II or Group III metals from the Periodic Table. In some variations, the first electrode comprises a metal selected from the group consisting of: mercury, gallium, indium, zinc, cadmium, combinations and alloys thereof. In certain preferred variations, the first electrode comprises mercury, gallium, indium, or combinations or alloys thereof. In certain particularly advantageous variations, the first electrode comprises mercury. Furthermore, in certain alternative variations, the first electrode may comprise a plurality of nanoparticles comprising a metal selected from the group consisting of: mercury, gallium, indium, zinc, cadmium, combinations and alloys thereof. In certain preferred variations, the first electrode nanoparticles may comprise indium.

In certain variations, the methods of the present teachings form a crystalline material. For example, the method may comprise contacting a liquid electrolyte, such as an aqueous electrolyte, with a first liquid electrode. The first electrode is in liquid form and is in electrical communication with a second electrode having a second opposite polarity from the first electrode. In certain variations, the liquid electrolyte may be formed by combining water and an oxide compound comprising a Group IV semiconductor element to form an aqueous electrolyte, while the first liquid electrode comprises a metal selected from the group consisting of: mercury, gallium, indium, zinc, cadmium, combinations and alloys thereof. In alternative variations, the electrolyte may be formed by combining one or more polar solvents with an oxide compound comprising a Group IV semiconductor element (where the one or more polar solvents are capable of dissolving the oxide compound). A crystalline material comprising the Group IV semiconductor element is generated by such a method by applying an electric potential to the first liquid electrode in contact with the electrolyte to drive an electrochemical reduction reaction that generates the crystalline material comprising the Group IV semiconductor element by precipitation at or within the first liquid electrode.

In certain aspects, the generating occurs by creating a flux of the Group IV semiconductor elements into the first liquid electrode when applying the electric potential from the first (and second) electrode. The Group IV semiconductor element concentration thus increases near the boundary of or inside the first electrode, where it is dissolved in the first electrode material. Such a process of "dissolving" may include the mixing of two phases with the formation of one new homogeneous phase or solution, or may also include a solvation process, where any stabilizing interaction of a solute or solute moiety and the solvent (or a similar interaction of solvent with groups of an insoluble material) occurs.

Thus, after dissolution or solvation of the semiconductor element into the first electrode material, in certain variations, the inventive methods further involve saturation of the first electrode material with the semiconductor element. This saturation causes precipitation of a solid form of the semiconductor element from the first electrode. Thus, in various aspects, a rate of generating of the solid precipitated semiconductor element is determined by controlling a magnitude of the applied electric potential between the first electrode and the second electrode. For example, in certain embodiments, the applied electric potential is greater than or equal to about the formal potential of the semiconductor reduction half reaction (−0.9 V vs. Ag/AgCl at pH=8.5 for Ge in water) to less than or equal to about an overpotential of 2 V. In this manner, a rate of generating of the material comprising the semiconductor element can be quite high, for example, greater than or equal to about $1 \times 10^{-9}$ mol cm$^{-2}$ s$^{-1}$. In certain variations, a rate of generating of the precipitated solid material comprising the semiconductor element is greater than or equal to about $1 \times 10^{-12}$ mol cm$^{-2}$ s$^{-1}$.

In certain variations, the methods of the present teachings form a crystalline material by contacting a liquid electrolyte, such as an aqueous electrolyte, with a first electrode that comprises one or more nanoparticles. The first electrode may comprise a plurality of nanoparticles comprising a metal selected from the group consisting of: mercury, gallium, indium, zinc, cadmium, combinations and alloys thereof. Such nanoparticles may be disposed on or form part of a conductive electrode substrate that does not participate in the electrochemical reaction. In certain preferred variations, the first electrode nanoparticles may comprise indium. The first electrode is in electrical communication with a second electrode having a second opposite polarity from the first electrode. In certain embodiments, the liquid electrolyte is formed by combining water and an oxide compound comprising a Group IV semiconductor element. In alternative variations, the liquid electrolyte may be formed by combining one or more polar solvents with an oxide compound comprising a Group IV semiconductor element (where the one or more polar solvents are capable of dissolving the oxide compound). A crystalline material comprising the Group IV semiconductor element is generated by such a method by applying an electric potential to the first electrode in contact with the electrolyte to drive an electrochemical reduction reaction that generates the crystalline material comprising the Group IV semiconductor element by precipitation at the first electrode.

In various aspects, the methods of the present teachings provide the capability to generate a precipitated solid material comprising the semiconductor element at ambient temperatures without any need for heat treatment for annealing. In certain aspects, the generating may be conducted at greater than or equal to room temperature (e.g., approximately 20-25° C.) to less than or equal to about 100° C.

Furthermore, the methods of forming such precipitated material may also include the ability to control morphology of the material by controlling the nature and magnitude of the applied electric potential applied to generate a polycrystalline material. Thus, in certain variations, a morphology of the crystalline materials formed from the inventive methods can be preselected to be in a shape of a filament, a cube, or a two-dimensional film or sheet of material.

In certain variations, the crystalline material comprising a semiconductor material is optionally selected to have a shape of a fiber or a filament. By "filament" it is meant that the component defines an evident longitudinal axis and thus has a so-called "axial geometry." Filaments having such an evident longitudinal axis include an elongated axial dimension, which is longer than the other dimensions (e.g., diameter or width) of the filament. In certain aspects, such elongated filament or fiber components have an axial geometry have an aspect ratio (AR) defined as a length of the longest axis divided by diameter of the component, which is preferably at least about 100. Thus, filaments, as used herein, may include fibers, wires, and the like.

Similarly, a "cube" encompasses three-dimensional polyhedrons having a substantially rectangular shape, including a solid of six equal square sides, as well as a parallelepiped (having offset angles between faces or faces of differing sizes). As referred to herein, the word "substantially," when applied to a characteristic of a material or method of this disclosure, indicates that there may be some slight variation in the characteristic without having substantial effect on the chemical or physical attributes of the composition or method. Notably, the filament and cube shapes of certain embodiments are not limiting as to the shapes that can be formed by the methods of the present disclosure, and in certain alternative embodiments, other shapes are likewise contemplated and may also be formed. For example, in certain variations, the present teachings provide the ability to generate "two-dimensional" structures, which may be in the form of films, leaf structures, or sheets of material, by way of non-limiting example. Such two-dimensional structures naturally have a major surface defined by an x-axis and a y-axis in an x-y plane, but also have thickness in a z-axis direction.

Advantageously, such methods provide the capability to form crystalline materials, such as polycrystalline or alternatively single crystal materials. Thus, in certain aspects, the crystalline material formed via such methods is a polycrystalline material. In yet other aspects, the crystalline material is a single crystal material. A "crystallized" material, as used herein, means the arrangement of atoms, ions, molecules and/or macromolecules into an ordered structure containing a three-dimensional periodic and repeating array of atoms, ions, or molecules and optionally contains at least one repeatable unit cell. In certain variations, the solid precipitated materials may comprise a single crystal (not having distinct grains with grain boundaries). In other aspects, such solid precipitated materials may comprise a plurality of distinct grains having grain boundaries, which are thus polycrystalline. In certain aspects, the present methods provide a randomly oriented crystallized structure (having a plurality of crystalline domains with random orientations).

Thus, in certain variations, the present disclosure further provides novel polycrystalline materials. In one such variation, an inventive material includes a precipitated solid is formed that comprises a semiconductor element selected from the group consisting of: silicon, germanium, or combinations thereof. The precipitated solid is crystalline and has randomly oriented crystal domains, where an average crystal domain size (a dimension along the longest region between respective grain boundaries) is greater than or equal to about 5 nm. In certain variations, the precipitated solid is crystalline and has randomly oriented crystal domains, where an average crystal domain size is greater than or equal to about 5 nm to less than or equal to about 500 micrometers (µm). In yet other variations, an average crystal domain size is greater than or equal to about 5 nm to less than or equal to about 10 micrometers (µm). In certain aspects, such a polycrystalline material is in the form of a filament (e.g., a wire), a cube, or a two-dimensional structure (e.g., a film, sheet, or leaf). In certain aspects, an orientation of crystal domains is randomized with respect to a major axis of the crystallized structure formed. For example, crystallites may be randomly oriented along an elongated axis of a filament.

The methods of the present disclosure may thus include contacting a liquid electrolyte with a first electrode, wherein the first electrode is in electrical communication with a second electrode having a second opposite polarity from the first electrode, wherein the liquid electrolyte is formed by combining water and an oxide compound of a semiconductor element selected from the group consisting of: silicon, germanium, or combinations thereof. The method optionally further includes generating a precipitated solid material comprising the semiconductor element by applying an electric potential to the first electrode in contact with the electrolyte to drive an electrochemical reduction reaction that forms a solid material comprising the semiconductor element by precipitation out of solution at or within the first electrode.

In certain aspects, the solid material is crystalline and the first electrode comprises a material that is inactive with respect to any parasitic electrolyte decomposition electrochemical reactions in the presence of the semiconductor element. In one particular exemplary embodiment, the solid material is crystalline and comprises silicon, the oxide compound comprises silicon dioxide ($SiO_2$), and the first electrode comprises a material that is inactive with respect to any parasitic electrolyte decomposition electrochemical reactions in the presence of the semiconductor element (silicon), so as to form the crystalline solid material. In certain aspects, the first electrode optionally comprises mercury or indium. In certain aspects, the first electrode comprises mercury. Thus, in certain variations, the solid material comprises silicon, so that the generating occurs by driving the silicon to the first electrode from the electrolyte, dissolving the silicon near or into the first electrode, followed by saturating the first electrode with the dissolved silicon, and then precipitating the silicon from the first electrode to form the solid material.

In other aspects, the solid material is crystalline and comprises germanium, the oxide compound comprises germanium oxide ($GeO_2$), and the first electrode comprises a material that is inactive with respect to any parasitic electrolyte decomposition electrochemical reactions in the presence of the semiconductor element (germanium), so as to form the crystalline solid material. In certain aspects, the first electrode optionally comprises mercury or indium. In certain aspects, the first electrode comprises mercury. In certain variations, the solid material that is formed comprises germanium, so that the generating occurs by driving the germanium to the first electrode from the electrolyte, dissolving the germanium near, at, or into the first electrode, followed by saturating the first electrode with the dissolved germanium, and then precipitating the silicon from the first electrode to form the solid material.

In other embodiments, the first electrode may comprise a plurality of nanoparticles having a desirable melting point temperature range that enables a nucleation site upon which the semiconductor material may dissolve within, crystallize, and grow, so that in accordance with the principles of the present teachings, a solid semiconductor material can be readily formed thereon. Metallic nanoparticles have been observed to have differing melting point behavior than a bulk macroscale metallic material having the same composition.

The melting point behavior of such metallic nanoparticles is believed to be more dependent upon surrounding environmental conditions.

Individual metal flux nanoparticles dispersed on an inert solid electrode support are likewise contemplated to synthesize an electrical/electrochemical device component. Less mobile flux materials, like indium (In) nanoparticles, can be used. Although bulk indium has a moderately low melting point (about 156° C.), the surface melting point of indium is near 100° C., and the melting point of small indium nanoparticles is below 100° C. Indium is not typically considered a liquid metal at room temperature. However, indium nanoparticles in intimate contact with germanium (Ge) have an unusually low melting point, with In—Ge nanoparticles apparently showing liquid properties at room temperature. This large melting point depression is believed to arise from large heteroepitaxial stress between two dissimilar materials.

Accordingly, in certain aspects, nanoparticle versions of metals have lower melting points than the same metals in bulk form. In certain embodiments, the first electrode may comprise a plurality of nanoparticles comprising a metal selected from the group consisting of: mercury, gallium, indium, zinc, cadmium, combinations and alloys thereof. The first electrode may also comprise a conductive material as a substrate for the plurality of nanoparticles that is otherwise inactive towards semiconductor electrodeposition, such as silicon. In certain aspects, the conductive material comprises a doped n-type silicon, by way of non-limiting example.

In one embodiment, the first electrode comprises a plurality of nanoparticles comprising indium (In), which enables the mechanism of semiconductor dissolution, crystallization and growth described herein. Thus, in certain aspects, nanoparticles comprising indium prepared on a conductive support that is otherwise inactive towards semiconductor (e.g., Ge) electrodeposition is a stable platform for the electrochemical preparation of individual semiconductor nanowire film electrode formations. See for example, FIG. 8a, showing a schematic with a solid electrode supporting an indium nanoparticle. The oxide compound of the electrolyte comprises germanium oxide ($GeO_2$). Germanium precipitates from the liquid electrolyte (comprising the germanium oxide) under applied voltage to form a crystalline germanium nanowire. Such principles are likewise applicable to other semiconductor materials and metallic nanoparticles. Thus, by employing a first electrode that comprises one or more nanoparticles, a solid material can be generated that is crystalline and comprises a semiconductor element, such as germanium.

Thus, in an electrochemical liquid-liquid-solid (LLS) process, such as those provided by the present teachings, unlimited amounts of crystalline or amorphous semiconductor materials can be formed without any physical or chemical templating agent is presented. The discussion herein pertains to a semiconductor element, germanium (Ge), but germanium is merely illustrative and the principles of the present teachings are readily applied to the formation of other semiconductor element materials.

Thus, the methods of the present disclosure are capable of producing unlimited amounts of crystalline solid germanium (Ge(s)) from electrolyte solutions that comprise an oxide of germanium ($GeO_2$(aq)). Furthermore, the methods of the present disclosure provide the ability to form semiconductor materials, like crystalline solid germanium (Ge(s)) having tunable nano-structured shapes or morphologies.

In one variation, such an electrochemical liquid-liquid-solid (LLS) process produces unlimited amounts of crystalline Ge(s) from $GeO_2$(aq) solutions with tunable nanostructured shapes without any physical or chemical templating agent required, as is required in conventional processes. In one embodiment, the method encompasses dissolution of the semiconductor Ge element into, saturation within, and precipitation of Ge from a liquid phase mercury electrode (Hg) to form a Ge—Hg amalgam that yields polycrystalline Ge(s) as-deposited. This route parallels vapor-liquid-solid and liquid-liquid-solid nanomaterials syntheses, but has the principal advantages of occurring at ambient conditions, in a single step, and under electrochemical control. Since the applied bias can relate to a flux of semiconductor element (Ge) into the liquid electrode, saturation and precipitation of Ge are controllable, affording a variety of material morphologies including dense films of oriented nanostructured filaments with large aspect ratios (greater than or equal to about 100, optionally greater than 103). Further, in the context of an electrode comprising one or more nanoparticles, applied bias likewise can control the properties of the material precipitated near the nanoparticles.

Such electrochemical liquid-liquid-solid processes are broadly applicable and not limited to only a Ge—Hg system. By way of non-limiting example, similar crystalline electrodeposition of Ge is observed for liquid Ga electrodes. Similarly, the principles of the present teachings are equally applicable to other semiconductor materials, such as silicon. Differences in the physicochemical (e.g., surface tension, density) and electrochemical (e.g., electrocatalysis) properties of these two liquid metal electrodes can potentially strongly affect the as-prepared electrodeposited semiconductor (e.g., Ge). Other metals with relatively low melting temperatures are also contemplated as liquid electrodes, as described above. In preferred aspects, the first electrode material has a relatively low melting point that enables the semiconductor material to dissolve within or near, crystallize, and grow. In certain variations, the first electrode material has a relatively low melting point that is less than or equal to about 100° C.

An electrodeposition process in accordance with the present teachings can occur at ambient conditions and involve a liquid electrolyte, a liquid electrode or an electrode that comprises solid nanoparticles, and a solid deposit to that generates bulk amounts of crystalline Group IV semiconductors without time-intensive and/or energy-intensive annealing post-treatment steps that are normally required for conventional formation processes to create bulk crystalline semiconductor material preparations. Thus, the present methods provide the ability to continuously conduct unabated electroreduction of crystalline Ge as in the present teachings, which has not been identified previously.

Furthermore, the present methods for generating an electrodeposited semiconductor material can optionally be combined with a useful anodic half reaction (e.g., anodic $Cl_2$ evolution) to yield an electrolysis process that produces useful chemical/material products at both electrodes. Further, the methods and electrochemical system of the present teachings represents a new and controllable experimental system for polycrystallization nucleation from saturated mixtures. The ability to precisely regulate the flux conditions of the soluble species into the liquid solvent (e.g., Hg) affords control and tunability not readily achievable in saturation/precipitation systems of interest like polymer blend crystallization, gelation, and mineral formation. Furthermore, modifications to a magnitude of applied potential in the system likewise modify the morphologies and character of the polycrystalline Ge deposits. Specifically, the present disclosure contemplates testing and validating evolving models of crystal nucleation.

A liquid-liquid-solid electrodeposition process as in various aspects of the present disclosure does not require the use of any templating agent to produce various nanostructured morphologies, as required by conventional formation processes. In certain variations, filaments formed in accordance with the present teachings are free of surfactants and did not have to be removed from a porous template prior to electrical device incorporation, which is atypical of nanostructured semiconductors prepared via wet-chemical routes.

Additionally, the unique aspects of supersaturation-precipitation involved with the inventive methods permits a myriad of distinct morphologies. Further variations in the electrodeposition process elicit decidedly different morphologies, including cubes, filaments or wires, and two-dimensional structures, like sheets or films, by way of non-limiting example.

In certain aspects, the present teachings are applicable to an electrochemical device, such as a battery. Batteries can generally be described as comprising three components: an anode that contains a material that is oxidized and generates electrons during discharge of the battery (e.g., while it is providing power); a cathode that contains a material that is reduced or accepts electrons during discharge of the battery; and an electrolyte that provides a medium for transfer of ions between the cathode and anode. Batteries containing lithium ions are particularly desirable, because these metals are light in weight, while possessing high standard potentials. For a variety of reasons, lithium batteries are, in particular, commercially attractive because of their high energy density, higher cell voltages, and long shelf-life. In certain variations, a component for an electrochemical cell, such as an electrode, comprises a precipitated material formed in accordance with certain aspects of the present teachings that includes a semiconductor element selected from the group consisting of: silicon, germanium, or combinations thereof. The precipitated solid material comprising the semiconductor element can be in a crystalline or polycrystalline form. For example, a plurality of filaments, such as nanowires, comprising precipitated crystalline germanium can be used as an electrode material for an electrochemical cell.

EXAMPLE 1

The following materials and chemicals are used in this example. Ethanol (190 proof, ACS spectrophotometric grade, commercially available from Aldrich), $H_2SO_4$ (Certified ACS, commercially available from Fisher), Hg (triply distilled, commercially available from D. F. Goldsmith), Zn foil (99.98%, 0.25 mm thick, commercially available from Alfa Aesar), Cd foil (99.85%, 0.5 mm thick, commercially available from Alfa Aesar), $GeO_2$ (99.999%, commercially available from Acros Organics), $Na_2B_4O_7 \cdot 10H_2O$ (Analytical Reagent Grade, commercially available from Mallinckrodt), $KHCO_3$ (99.99%, commercially available from Aldrich) and KBr (99%, commercially available from Fisher) are used as received. $H_2O$ with a resistivity >18.2 $M\Omega cm^{-1}$ (commercially available from Barnsted Nanopure) is used throughout. Glass coated with a 400 nm fluorine-doped tin oxide layer (FTO, TEC 15, Rs<12 $\Omega cm^{-1}$, commercially available from Pilkington) is used as a support substrate for scanning electron microscopy.

Germanium electrodeposition occurs with the following equipment. CH Instruments 760c and Schlumberger SI 1286 potentiostats are used to perform potentiostatic electrodeposition. A glass, single-compartment, three-electrode cell is employed with a platinum (Pt) mesh and a Ag/AgCl (sat. KCl) electrode serving as the counter and reference, respectively.

For electrodeposition with zinc (Zn) and cadmium (Cd) electrodes, Zn and Cd foils are respectively cut into small rectangular sections and electrical contact is made by welding Cu wire to a corner in a propane/air flame. The Cu wire is then threaded through a 6 mm diameter glass tubing and the contact is insulated with an inert epoxy (1 C Hysol, Loctite), exposing a conductive surface area of about 2 $cm^2$ (determined through computer-captured optical images and image analysis software).

Immediately prior to use, electrodes are etched in 1 M $H_2SO_4$ for 10 seconds, then rinsed with $H_2O$ and dried under $N_2(g)$. For deposition at Hg, a circular pool with a surface area of 5.1 $cm^2$ is used and electrical contact is made with Pt wire. $N_2(g)$ is bubbled through all solutions for 20 min prior to the start of deposition and an $N_2$ atmosphere is maintained above the solution layer in the cell during the deposition.

After electrodeposition at a mercury electrode (Hg), the electrolyte is repeatedly diluted with $H_2O$ while being incrementally removed from the cell via pipette. The majority of the Hg is then also removed via pipette from under the Ge film. A small volume of ethanol is then added to the cell, which is subsequently sonicated for several seconds. This resulted in a black colored suspension that is transferred to a secondary container. Additional ethanol is added to the cell and sonication is repeated and the suspension again removed. This process is repeated until a dark colored suspension is no longer produced in the cell. The ethanol is evaporated from the suspension under a stream of $N_2(g)$, leaving the electrodeposited Ge.

The electrodeposited germanium is analyzed as follows. Cyclic voltammetry and chronocoulometry experiments are performed with an Eco Chemie Autolab PGSTAT302N potentiostat. A glass, two-compartment (sintered glass separator), three-electrode cell is employed with a Pt mesh and a Ag/AgCl (sat. Cl) electrode serving as the counter and reference, respectively. Hg pool and Zn and Cd foil working electrodes are constructed as described above. Ar(g) is bubbled through all solutions for 20 min prior to the start of the measurements and an Ar atmosphere is maintained above the solution layer in the cell during measurements.

The electrodeposited germanium material is characterized as follows. Scanning electron microscopy (SEM) is conducted with a FEI Nova Nanolab Dualbeam FIB-SEM operated at 5 kV with an in-lens secondary electron detector. Ge electrodeposited at Hg is drop-cast from an ethanol suspension onto FTO sections for analysis. Transmission electron microscopy (TEM) is performed with a JEOL 3011 TEM with a LaB6 source operated at 300 kV. Scanning transmission electron microscopy is performed with a JEOL 2010F (S)TEM with a Schottky field emission gun operated at 200 kV and equipped with an EDAX Si(Li) EDS detector.

All TEM specimens are prepared by drop-casting sonicated ethanol suspensions on copper TEM grids with ultrathin carbon films on holey carbon (Ted Pella). Powder X-ray diffraction patterns of the electrodeposited Ge are acquired with a Bruker D8 Advance diffractometer equipped with a Cu Kα source, parallel beam optics and a LynxEye detector. Infrared spectra are recorded with a Thermo Scientific Nicolet 6700 FT-IR spectrometer in transmission mode (KBr pellet) with a wide-band HgCdTe detector. Raman spectra are obtained with a Renishaw in Via spectrometer equipped with a Leica microscope, an Olympus SLMPlan 20× objective (numerical aperture=0.35), a 1800 lines/mm grating and a RenCam CCD detector. A 514.5 nm Ar+ laser (Laser Physics 25s) is used as the excitation source with a radiant flux of 50 µW incident on the sample.

Metal contact pads are fabricated photolithographically on a 2.25 cm² p-type Si(100) wafer section (0.01-0.02 Ωcm, B-doped, MTI corporation) with a 50 nm thermally grown oxide overlayer. Megaposit SPR 220 3.0 is spincoated at 5000 rpm for 30 seconds and exposed for 7.5 seconds on a MA/BA6 ZUSS Microtech aligner. The sample is subsequently developed for 20 seconds in Microposit MF-319 and an oxygen plasma with a power of 80 W for 30 seconds is used to clean the surface of organic residue. A 10 nm Ni—Cr adhesion layer followed by a 90 nm Au contact layer are deposited in a Cooke electron beam evaporator.

Electrodeposited Ge filaments are drop-cast from an ethanol suspension onto the device structure and loaded into a Nova Nanolab FIB-SEM. Metallic (Pt) contacts to the Ge filaments are formed directly by focused electron-beam assisted chemical vapor deposition (ESA-CVD) of $C_5H_4CH_3Pt(CH_3)_3$ through gas injection. An Alessi probe station with a Keithley 4200-SCS is used to measure electrical properties. Current is sourced (1-10 nA) through the two outer contacts and the voltage is measured between the inner two contacts. Ten data points are recorded at each current bias with a sampling rate of 10 points per minute and the average is used to calculate the resistance.

FIG. 1a shows voltammetric responses for the electroreduction of concentrated $GeO_2$(aq) solutions at large overpotentials that favor the rapid synthesis of bulk amounts of Ge. FIG. 1a displays the voltammetry observed with a Hg pool electrode in contact with 10 mM $Na_2B_4O_7$, both with and without 50 mM $GeO_2$. In the absence of dissolved $GeO_2$, an exchange current density of $1.9 \times 10^{-4}$ mA cm$^{-2}$ and a Tafel slope of −330 mV per decade described $H_2$ evolution response at Hg. In the presence of 50 mM $GeO_2$, the cathodic current increased substantially due to the reduction of solvated germanium oxide, $HGeO_3^-$ to Ge(s) at potentials more negative than −1.2 V vs. Ag/AgCl as shown via the mechanism of Reaction (1):

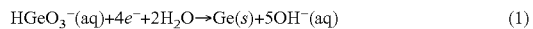

$$HGeO_3^-(aq) + 4e^- + 2H_2O \rightarrow Ge(s) + 5OH^-(aq) \quad (1)$$

indicating that at this formal concentration the Hg electrode is more electroactive towards Reaction 1 than $H_2$ evolution. The voltammetric response is nominally scan rate independent, and exchange of the borate buffer with $KHCO_3$(aq) effected no change in the current magnitudes or amount of electrodeposited Ge. Two anodic voltammetric waves are observed at applied potentials, E, of −0.5 and 0.0 V vs. Ag/AgCl for the oxidation of electrodeposited Ge6 but are not investigated further.

Chronocoulometric experiments conducted on the timescale of hours showed that the observed Ge reduction process is stable and not fouled by $H_2$ evolution (FIG. 1b). FIGS. 1c and 1d contrast the appearance of the electrode interface before and after electrodeposition at the Hg electrode biased at −1.9 V vs. Ag/AgCl for 20 min. By comparison, electrodeposition of Ge onto an electrode of Cd and Zn, two other Group IIB metal electrodes with similarly poor electrocatalytic properties for $H_2$ evolution, yielded significantly less Ge than with a Hg pool electrode (faradaic efficiencies for Ge electrodeposition at Hg, Cd, and Zn electrodes at an electrode potential, E=−1.5 V vs. Ag/AgCl are 89±6%, 24±3%, and 18±11%, respectively). The deposited Ge on Cd or Zn electrodes is amorphous, while the deposited Ge on the Hg electrode is crystalline.

The as-collected black film electrodeposited at Hg pool electrodes shows strong evidence of crystallinity. The first order Raman spectra obtained for long (t>1.5 h) Ge electrodepositions at several constant applied biases exhibited a single strong signature near 300 cm$^{-1}$, characteristic of crystalline Ge(s) (FIG. 2a). The absence of a phonon mode centered near 270 cm$^{-1}$ indicated no substantial content or an absence of amorphous Ge.

The Raman spectra also showed that the potential used during the electrodeposition process influences the resultant crystalline Ge domain size. The main spectral signature is red-shifted slightly and broadened for material produced at increasingly more negative potentials, indicating the crystalline domain sizes are approaching or below the 24.3 nm Bohr exciton radius for Ge. While not shown, corresponding FTIR and Raman spectra of these samples bore no evidence of hydrogenation, i.e., Ge-$H_x$. Separate powder X-ray diffractograms of the electrodeposited Ge (FIG. 2b) exhibited reflection patterns consistent with the premise that as-prepared electrodeposited Ge possesses a diamond cubic lattice and no crystalline, solid Ge—Hg alloy.

The relative intensities of the peaks in the diffractograms also indicated no net Ge crystalline orientation for all applied potentials. However, the line widths in the diffractograms are sensitive to the electrodeposition potential, with a perceptible broadening of each signature for Ge electrodeposited at more negative potentials. Using a Rietveld-type analysis, the diffraction patterns in FIG. 2b, FIG. 2c shows average crystalline domain sizes ranging between 53 nm and 8 nm for Ge electrodeposited between −1.2 and −2.7 V vs. Ag/AgCl. The dependence is non-monotonic, with a large decrease in average crystalline domain size between −1.2 V and −1.9 V vs. Ag/AgCl and a nominally consistent crystalline domain size of 8 nm between −1.9 V and −2.7 V vs. Ag/AgCl.

Representative scanning electron micrographs of the innate morphologies of Ge electrodeposited at E=−1.2 V, −1.5 V, and −1.8 V vs. Ag/AgCl are shown in FIGS. 3a-c. At the most positive potential, the as-prepared Ge deposits exhibited an irregular morphology consisting of large particles without any discernible arrangement. At more negative applied potentials, the grains thinned and appeared loosely interconnected. At E=−1.8 V vs. Ag/AgCl, the as-deposited Ge films showed a dense, leaf-like structure.

The texture of the Ge films changes markedly at E≥−1.9 V vs. Ag/AgCl. FIG. 3d illustrates three dimensional mats of vertically aligned Ge filaments observed for films prepared at E=−2.7 V vs. Ag/AgCl. The inset of FIG. 3d highlights the individual filament tips at the bottom of each film section. Film sections as large as $2.5 \times 10^3$ μm² are collected from the Hg electrode interface and have uniform morphology across the entire electrode surface area. The length of the dense mat of filaments is dependent on the total time of electrodeposition and is about $10^{-5}$ m for long (t≥2.5 hours) electrodeposition times. FIG. 3e highlights a side-view of these films to illustrate the high density, uniformity, and length of the Ge filaments. The average diameter of the as-collected Ge filaments is a function of the bias used for electrodeposition, with averaged diameters for the filaments described in FIGS. 3f-h of 53±16, 45±14, and 26±9 nm. FIGS. 3f-h also shows that the surfaces of the Ge filaments are not smooth and uniform but instead possessed a nodular texture with diameters that slightly fluctuated along their entire lengths. In certain aspects, the methods according to the present teachings can grow sheets comprising germanium comprising layers of germanene (e.g., comprising an allotrope of germanium that has a hexagonal, planar structure similar to graphene).

FIG. 4a highlights a bright field transmission electron micrograph (TEM) of a representative Ge filament prepared via electrodeposition at E=−2.7 V vs. Ag/AgCl. FIG. 4a shows the periodicity of the diameter size along the length of the filament. In addition, variation in the local contrast of the filament is apparent, suggesting the presence of multiple and distinct crystalline domains. While not shown, phase contrast TEM exhibited lattice fringes from multiple non-aligned crystallites as well as Moiré fringes indicating partially misoriented crystalline domains with the same lattice parameter through the projected volume of the filaments. A selected area electron diffraction pattern collected for the same isolated filament in FIG. 4a is shown in FIG. 4b. The ring pattern confirms the polycrystalline nature of the Ge filament and indicates that the local structure comprises multiple, non-aligned domains of crystalline Ge.

FIGS. 4c-e illustrate dark field diffraction contrast transmission electron micrographs collected with distinct (220) diffracted electron beams to form each respective image. For these three dark field images, the bright sections in the images identified local regions within the filament at an orientation commensurate with the particular (220) diffracted beam used to form the image. The absence of any obvious or consistent pattern in the contrast of the filaments across FIGS. 4c-e is strong evidence of no long range ordering or preferred orientation of the Ge crystalline domains along the filament length, but rather indicates a random orientation. Specifically, the data indicate the composition of these filaments is best described as a collection of randomly fused Ge crystallites.

The electrical properties of individual polycrystalline Ge filaments formed in accordance with the present teachings are assessed through 2- and 4-terminal single filament devices prepared via electron-beam Pt electrode patterning. The Pt/Ge contact resistances are nominally 107Ω. FIG. 4f displays the observed current potential response for a 4 point probe device. The measured resistivities for the as-prepared Ge filaments are on the order of 0.4 Ωcm, much lower than expected for either amorphous Ge or undoped crystalline Ge. Hg is a known p-type dopant in Ge and trace incorporation of Hg (from the electrode) with the Ge crystallites is likely a contributor to the relatively low resistivity. Gated current-potential measurements show no field-dependence of the measured resistivity for gate voltages of ±20 V, precluding the determination of n- or p-type character. The measured resistivities are higher than expected for degenerate doping of crystalline Ge, but grain boundary scattering along the filament length is expected to increase significantly the resistance through a filament. Such materials prepared in accordance with certain aspects of the present disclosure are thus of sufficient quality for electrical applications.

While not limiting the present teachings to any particular theory, the cumulative data suggests a three step process for Ge electrodeposition at Hg involving a reduction of $HGeO_3^-$ (aq) to Ge, dissolution of Ge into the bulk Hg electrode pool as an amalgam, and supersaturation of the Ge amalgam that results in the precipitation of crystalline Ge (FIG. 5a). The low solubility, $(2\pm0.5)\times10^{-7}$ M, and diffusivity, $(1.3\pm0.1)\times10^{-5}$ $cm^2s^{-1}$ of Ge in Hg support the contention that under high current densities for Ge reduction, for example, high Ge fluxes into the interior of the Hg pool, saturation of the near surface region of the Hg pool with Ge is readily achieved. In effect, this Ge electrodeposition process has stronger parallels specifically to systems involving precipitation from supersaturated solutions like crystallization in polymer blends, solutions of dissolved inorganic minerals, and supercooled molten metal alloys, rather than electrodeposition of ramified metal filaments.

For electrodeposition of Ge filaments at Hg, the applied electric field between the working and counter electrodes is small ($<10^0$ V $cm^{-1}$), a change in the buffer electrolyte identity did not appear to produce any perceptible change in the electrodeposition process or product, and the filaments formed extended three-dimensional mats that covered the entire surface of the Hg pool with a thickness dictated by the electrodeposition time. Electron micrographs indicated the tops of the Ge filament films (FIG. 5b) have leaf-like morphologies similar to that shown in FIG. 3c and that discrete thin filaments emanate from the underside of this top layer.

Based on the relative densities of Ge and Hg (5.3 and 13.5 g $cm^{-3}$, respectively), buoyancy likely drives Ge out of the Hg pool and back into the electrolyte. While not limiting the present teachings to any particular theories, these aspects suggest that Ge filament formation occurs as illustrated in FIG. 5c, where a dense layer of Ge crystallites initially form, further Ge rapidly precipitates as a high density of filaments underneath the initial grains in the supersaturated amalgam, and then the filament film grows as a unidirectional spherulitic deposit. In general, spherulitic growth is thought to occur when the rotational and translational motion of precipitating species during nucleation are uncoupled, preventing crystallization along a specific direction.

Spherulitic growth is possible in saturated mixtures where large chemical potential gradients (effected through temperature) of the precipitating species can drive nucleation and directional solidification. Although the Ge—Hg system of the present teachings is isothermal, the depth-dependent Ge concentration within the liquid electrode, set by flux of reduced Ge at the electrode/electrolyte interface, is related to a chemical potential gradient for Ge in the amalgam. Unidirectional spherulitic growth, e.g., dense, branched polycrystalline filament growth from a plane rather than a central point, is not commonly observed. While not limiting the present teachings to any particular theory, the observed morphology and randomized orientation of the crystalline domains within the Ge filaments appear to be consistent with spherulitic model predictions.

In certain aspects, the presented electrodeposition process for a semiconductor material (e.g., Ge or Si) at Hg pool electrodes has several salient features. First, this electrodeposition scheme is a single-step process that requires significantly less time and energy than the standard routes for producing bulk quantities of crystalline semiconductor materials like Ge or Si. For example, a conventional industrial method for preparing crystalline Ge involves a two-step thermal reduction of $GeO_2$ (energy input >500 kJ $mol^{-1}$). The energy input required to drive Reaction (1) is 215 kJ $mol^{-1}$ at 0.4 V overpotential.

FIG. 6 shows a morphology of solid electrodeposited germanium Ge(s) comprising cube-shaped particles, observed during electrodeposition continuously applying a pulsed potential-time waveform at a Hg electrode in 50 mM $GeO_2$ (aq) with 10 mM $Na_2B_4O_7$. While not limiting the present teachings to any particular theory, it appears that a particular morphology in the resultant electrodeposited material can be controlled and is related to the type and magnitude of potential applied (whether direct current or alternating current/pulsed).

EXAMPLE 2

In alternative variations, the first electrode may comprise a plurality of nanoparticles having a desirable melting point temperature range that enables a nucleation site upon which the semiconductor material may dissolve within, crystallize, and grow, so that in accordance with the principles of the present teachings, a solid semiconductor can be readily formed thereon. By way of example, FIG. 7a shows an SEM image of a solid filament or nanowire comprising electrodeposited germanium Ge(s) formed on an indium nano-particle electrode (shown in the circle). The indium nanoparticle has a diameter of 100 nm. FIG. 7b shows energy dispersive X-ray spectra indicating the presence of only indium in the nanoparticle region at the tip of the nanowire. FIG. 7c shows phase contrast transmission electron micrographs of Ge filaments electrodeposited onto the indium nano-particle, while FIG. 7d shows a selected area electron diffraction pattern collected for the same isolated filament in FIG. 7a, where the ring pattern confirms the polycrystalline nature of the Ge filament grown on the surface of the indium nanoparticles.

EXAMPLE 3

The following materials are used in this example. Methanol (Certified ACS, Fisher), acetone (Certified ACS, Fisher), $InBr_3$ (99.99%, Alfa Aesar), Li foil (Strem Chemicals), $GeO_2$ (99.999%, Acros Organics), HF (49%, Transene Inc.), $H_2O_2$ (30%, Fisher), $H_2SO_4$ (doubly distilled, Sigma-Aldrich), $Na_2B_4O_7 \cdot 10H_2O$ (Analytical Reagent Grade, Mallinckrodt), $LiPF_6$ (99.99%, Aldrich), ethylene carbonate (Aldrich), and diethyl carbonate (Aldrich) are used as received. Materials used for electrode fabrication include Si (P-doped n-type, 1-10 ohm cm, 0.5±0.025 mm thick), Cu foil (99.9%, McMaster-Carr), In(s) (99.9+%, Aldrich) and Ga(l) (99.99%, Aldrich). Water with a resistivity >18.2 MΩ cm$^{-1}$ (Barnsted Nanopure) is used throughout.

Powder X-ray diffraction patterns are collected with a Bruker D8 Advance diffractometer equipped with a Cu Kα source, 0.6 mm incident beam slit and a Lynx Eye detector. The peak refinement and crystallite size analysis are performed in Crystal TOPAS (VERSION 4.1). Transmission electron microscopy (TEM) is performed with a JEOL 3011 TEM equipped with a $LaB_6$ source operated at 300 kV. Samples for TEM analysis are prepared by removing as-deposited Ge nanowires from the electrode supports through sonication in methanol for 30 sec. The suspension is then drop cast onto copper grids coated with ultra-thin carbon films on holey carbon (Ted Pella). Scanning electron microscopy (SEM) is conducted to characterize the quality of as-prepared Ge nanowire films with a FEI Nova Nanolab Dual beam FIB-SEM operated at 5 kV with an in-lens secondary electron detector. Energy dispersive spectroscopy (EDS) is performed at 10 kV with an EDAX UTW detector. Particle density and size distributions are analyzed based on the SEM images over an area of 5.66 μm$^2$ using ImageJ (Version 1.45s) software.

All In and Ge electrodepositions are performed with a CH Instruments 760C potentiostat and either a custom-made Teflon cell with a 0.0252 cm$^2$ window (for electrodeposition on Si) or a single-compartment glass cell (for electrodeposition on Cu foil). In either case, a three-electrode configuration with a Pt wire counter electrode and a Ag/AgCl (sat. KCl) reference electrode is employed. All reported electrochemical potentials are with respect to E(Ag/AgCl)(sat. KCl). Prior to use, Si sections are cut, sonicated in acetone for 15 min, etched in 1:3 (v/v) 30% $H_2O_2$:98% $H_2SO_4$ for 30 min at 50° C., and etched in 5% HF for 1 min to remove surface oxides. Immediately following the last etch step, each Si section has an In—Ga eutectic film applied to the back and then is transferred onto a stainless steel support. Unless stated otherwise, In nanoparticles are electrodeposited at a constant potential in 0.1 M $InBr_3$(aq) and 0.1 M $KNO_3$(aq). Ge nanowires are subsequently electrodeposited at a constant applied potential in 0.05 M $GeO_2$(aq) and 0.01 M $Na_2B_4O_7$(aq).

Ge nanowire electrodeposition using In nanoparticles with diameters >100 nm is performed. Large In nanoparticles are prepared through electrodeposition of In onto n-Si at −1.6 V vs. Ag/AgCl for 1 s in solution containing 0.01 M $InBr_3$(aq) and 0.1 M $KNO_3$(aq). Large In nanoparticles favor the growth of multiple Ge nanowires from a single nanoparticle, in contrast to the observations for small In nanoparticles. Ge nanowires electrodeposited with an n-Si electrode with large In nanoparticles.

Current-potential responses for n-Si electrodes coated with indium nanoparticles for the electrodeposition of germanium (Ge) nanowires via certain processes according to the present teachings are explored in Example 3 (see FIG. 8b summarizing the current-potential responses for such n-Si electrodes coated with In nanoparticles during electrodeposition of Ge nanowires). Bare n-Si electrodes immersed in aqueous electrolyte with dissolved $GeO_2$ show no evidence of Ge electrodeposition at any applied potential in this electrolyte, in accord with past reports of Ge electrodeposition. These electrodes also yield similar current-potential responses as n-Si electrodes coated with In nanoparticles immersed in aqueous electrolyte without dissolved $GeO_2$, indicating that the presence of In nanoparticles does not substantially enhance the observable activity for $H_2$ evolution at negative applied potentials, in agreement with the known poor electrocatalytic activity of In for $H^+$ reduction.

In an aqueous electrolyte containing dissolved $GeO_2$, n-Si electrodes coated with In nanoparticles show uniformly higher current densities at potentials more negative than −1.4 V vs. Ag/AgCl, in accord with the notion that the reduction of dissolved $GeO_2$ occurs exclusively at the In nanoparticles. Chronoamperometric experiments show that the Ge electrodeposition process is unabated over the course of at least 5 min (see FIGS. 13a-b). Raw (uncorrected) chronoamperometric responses for (black line) a bare n-Si electrode and (red line) an n-Si electrode coated with In nanoparticles in 0.01 M $Na_2B_4O_7$ and 0.05 M $GeO_2$ biased at −2.0V vs. Ag/AgCl for 10 min is shown in FIG. 13a. FIG. 13b shows chronocoulometric response for an n-Si electrode coated with In nanoparticles biased at −2.0V vs. Ag/AgCl for 10 min while immersed in 0.01 M $Na_2B_4O_7$(aq) and 0.05 M $GeO_2$(aq) after subtraction of the background faradaic charge for $H^+$ reduction. These electrodes visibly darken during the course of electrodeposition, eventually becoming dull black. FIG. 8c illustrates data from a current transient (corrected for contribution from faradaic current from $H^+$ reduction) from a chronoamperometric experiment with a n-Si electrode coated with In nanoparticles immersed in an aqueous electrolyte with 0.05 M $GeO_2$(aq) and biased at −2.0 V vs. Ag/AgCl. These experiments consistently show a peaked profile mirroring the shape typically observed in data for chronoamperometric electrodepositions. The inset to FIG. 8c shows the normalized current-time response in relation to the expected transient response from the two prevailing models (instantaneous and progressive nucleation) for electrodeposition processes. The collected data at short times agrees well with the instantaneous nucleation model, suggesting Ge electrodeposition occurs immediately at a finite number of In nanoparticles (in other words, the electrodeposition of each Ge nanowire in the film begins instantly and uniformly, rather than a progressive initiation of additional Ge nanowires throughout the potential step experiment).

FIGS. 9a-9c collect data describing the crystallinity of the as-prepared Ge nanowires. Following Ge electrodeposition at −2.0 V vs. Ag/AgCl for 60 min, electrodes are removed from solution and dried under $N_2$(g). FIG. 9a shows the observed X-ray diffraction patterns for these as-prepared materials, indicating crystalline Ge with the expected diamond cubic lattice. Line broadening indicated polycrystalline domains approximately 20 nm and a lattice constant of 5.67 Å, in good agreement with the expected lattice constant of 5.66 Å for bulk crystalline Ge. Separate transmission electron microscopy performed on as-prepared Ge nanowires similarly shows evidence of strong crystalline character.

FIGS. 9b and 9c indicate the Ge nanowires are not single crystalline, but rather polycrystalline (as evidenced by variations in contrast and the polycrystalline pattern in selected area electron diffraction) with grain sizes in accord with those noted from X-ray diffraction. These features are consistent with previous observations of Ge nanowires prepared via a process according to the present teachings at macroscale liquid flux electrodes. Higher resolution micrographs (FIG. 9c) further show that the polycrystalline grains are oriented randomly with respect to the long axis. From the observed lattice fringes and the inset in FIG. 9c, the distance between the (111) planes, d111, is estimated as 3.29 Å, in reasonable accord with the known d111 value of 3.26 Å for diamond-like Ge crystal.

FIGS. 10a-10h and 11a-11c describe how the Ge nanowire films are influenced by the features of the In nanoparticles. As shown in the top-down scanning electron micrographs in FIGS. 10a, 10c, 10e, and 10g, experiments are performed on n-Si electrodes with varied loadings of In nanoparticles. The density of In nanoparticles is controlled solely through the applied potential used to electrodeposit indium (In) from solution. Through this preparation, the average size of In nanoparticles tends to decrease as the density of In nanoparticles is increased. Each of these n-Si platforms loaded with In nanoparticles is then subject to the same Ge electrodeposition step at −2.0 V vs. Ag/AgCl lasting 10 min. Three points are visually apparent from the micrographs in FIGS. 10a-10h. First, at high densities of In nanoparticles, the density of Ge nanowires tracks the density of In nanoparticles. High densities of Ge nanowires are electrodeposited only on n-Si substrates decorated with a high density of In nanoparticles (e.g., FIGS. 10e, 10f and 10g, 10h). Larger nanowires are also more readily observed with less dense In nanoparticles (FIGS. 10a, 10b and 10c, 10d). Second, the diameters of the electrodeposited Ge nanowires tracked the diameters of the In nanoparticles, e.g., thicker Ge nanowires are observed with larger In nanoparticles. Third, each Ge nanowire appears to emanate from a single and distinct location on the electrode surface (FIGS. 10b, 10d, 10f, 10h).

The correlations between In nanoparticle and Ge nanowire size/density are shown more quantitatively in FIGS. 11a-11c. FIG. 11a is a plot of the Ge nanowire density as a function of the In nanoparticle density, spanning a range of 19.3 to 207.5 objects µm$^{-2}$. The dashed line indicates the expected correlation if every In nanoparticle yields a single Ge nanowire. The cumulative data from four separate trials indicates that the correlation was closer to one Ge nanowire obtained for every two In nanoparticles, thus not every In nanoparticle appears to facilitate the electrodeposition of a Ge nanowire under the employed conditions. In these experiments, In nanoparticle sizes are kept below 100 nm and the majority of In nanoparticles are below 60 nm. Experiments with In nanoparticles larger than 100 nm show larger nanoparticles tend to seed the electrodeposition of multiple Ge nanowires.

FIG. 11b illustrates that the electrodeposition protocol used to prepare the In nanoparticle films on n-Si yielded broad distributions with respect to nominal particle diameter. The asymmetries in the distributions partially reflect the insensitivity of the scanning electron microscopic analysis towards ultra-small (<5 nm) In nanoparticles. Nevertheless, FIG. 11c demonstrates that the observed size (width) distributions of the Ge nanowires closely followed the distributions in FIG. 11b. Separately, FIG. 11c also shows that the variation in diameter, as described by the distribution width, was slightly narrower for the electrodeposited Ge nanowires as compared to the parent In nanoparticles, particularly at higher densities.

Additional measurements are performed to elucidate the location of the In nanoparticle following electrodeposition of a Ge nanowire. FIGS. 5a-5c presents a set of micrographs highlighting the physical orientation of a single electrodeposited Ge nanowire and energy dispersive spectroscopic (EDS) maps of Ge and In, respectively. A matched secondary electron image of the nanowire in FIG. 12a more clearly identifies a second nanowire located at the top left corner and a second In nanoparticle at the top right corner of FIG. 12a (denoted with arrows in FIGS. 12b and 12c, respectively). EDS Ge mapping (FIG. 12b) shows the nanowire is composed of Ge with no detectable In throughout the length. Similarly, In mapping (FIG. 12c) shows localized concentrations of In only at the base of the Ge nanowire and not at the tip.

EXAMPLE 4

The presence of a metallic nanoparticle at the base of each Ge nanowire suggests that every Ge nanowire is electrically addressable and accordingly electrochemically active. To test this hypothesis, the activity of as-prepared Ge nanowire film electrodes as Li$^+$ battery anodes is explored in this example. For Li$^+$ battery applications, Ge is an attractive anode material because it has a larger theoretical charge-discharge capacity than graphite (1600 mA h g$^{-1}$ for Li$_{4.4}$Ge vs. 372 mA h g$^{-1}$ for LiC$_6$) and supports faster Li$^+$ diffusivity than Si, facilitating Li$^+$ batteries with faster charge-discharge times. A significant disadvantage of conventional Ge electrode in Li$^+$ batteries is the large volumetric expansion upon Li$^+$ insertion (intercalation) which effectively pulverizes the material and limits the total lifetime of the electrode. In this capacity, the Ge nanowires prepared in accordance with certain aspects of the present teachings show both high and long-lasting Li$^+$ charge-discharge capacities, specifically believed to be due to their nanostructured, high aspect ratio electrode form factor. Since Si can also alloy with Li, a copper (Cu) foil is used as the electrode support for Ge nanowire electrodeposition for films that are interrogated as potential Li$^+$ battery electrodes. The as-prepared, dense Ge nanowire film electrodes are dried, massed, and then immediately tested as Li$^+$ battery electrodes without any further processing and/or application of binding agents or conductive carbon additives.

Prior to cell assembly, the mass of the electrodeposited Ge nanowires is determined with a Sartorius ME36S microbalance (readability 0.001 mg). All battery cells are assembled in a Vacuum Atmospheres OmniLab glove box under Ar(g). For each electrode, a Cu substrate containing about 100 µg Ge nanowires is loaded in a home-made PTFE union cell with a 2 cm inner diameter. Li foil is used as the counter/reference electrode, separated from the working electrode by a piece of filter paper (Whatman, grade 2). The electrolyte is 1 M LiPF$_6$ in 2:1 (v/v) ethylene carbonate and diethyl carbonate. Both solvents are dried over P$_2$O$_5$ prior to use.

The capacity and stability for Li$^+$ insertion-deinsertion of as-prepared Ge nanowires films are assessed in a two electrode configuration with 1 M LiPF$_6$ in 2:1 (v/v) ethylene carbonate/diethyl carbonate. Capacity measurements for Li$^+$ charge and discharge cycles are performed with a CH Instruments 760C potentiostat in a 2 electrode configuration with a potential window from +2.00 V to +0.05 V vs. E(Li$^+$/Li). For certain cycling experiments, electrodes are initially cycled at 1 C rate for one charge-discharge prior to repetitive cycling at 5 C rate.

Li$^+$ insertion capacity of Cu and In-coated Cu is tested here. The contribution from the underlying substrate and In nanoparticles to the measured Li$^+$ charge-discharge capacity at 1 C rate in 1 M LiPF$_6$ in 2:1 (v/v) ethylene carbonate and diethyl carbonate is determined through a series of control experiments using the same applied current density for all measurements. Charge-discharge curves for various cycles are recorded for an electrodeposited Ge nanowire film electrode. FIG. 14 summarizes representative capacity cycling responses for Ge nanowire film electrodes (electrodeposited at −2.0 V vs. Ag/AgCl for 10 min in 0.01 M $Na_2B_4O_7$(aq) and 0.05 M $GeO_2$(aq)), Cu electrodes coated with In nanoparticles (electrodeposited at −2.0 V vs. Ag/AgCl for 30 sec in 0.1 M $InBr_3$(aq) and 0.1 M $KNO_3$(aq)), and bare Cu electrodes. FIG. 15 shows representative potential-capacity curves for the $20^{th}$ cycle for Ge nanowire film electrodes, Cu electrodes coated with In nanoparticles, and bare Cu electrodes. Bare Cu electrodes exhibit no meaningful $Li^+$ capacities, while Cu electrodes coated with In nanoparticles support discharge capacities of 50 mA h $g^{-1}$, e.g., less than 5% of the measured capacity of the Ge nanowire film electrodes.

The $Li^+$ charge and discharge capacities at 1 C rate are recorded as a function of repetitive cycling for three separately prepared Ge nanowire film electrodes prepared in accordance with certain aspects of the present teachings. The general profile of these chronopoteniograms mirrors previous reports of crystalline Ge charge-discharge curves at this C-rate. Similarly, the notable drop off in charging capacity after the first cycle is in accord with the known irreversible film formation at the solid-electrolyte interface of Ge $Li^+$ battery electrodes. Control experiments performed with just the Cu foil and the Cu foil coated with In nanoparticles show markedly different electrochemical behavior and much lower capacities for storing $Li^+$ (FIG. 14). The magnitude of the measured discharge capacity supports the notion that all of the Ge nanowires are electrochemically active.

Cycling data for an entire 26 cycle sequence was observed. Following the second charge-discharge cycle, every subsequent cycle occurred with greater than 91% Coulombic efficiency. The discharge capacity slowly decreases over the course of the entire cycling period, dropping by less than 25% from the first to the twentieth discharge. A decrease in capacity over repeated cycles is common in $Li^+$ battery electrodes comprising Group IV elements that alloy with Li due to pulverization from extreme volumetric expansion. The decay shown in embodiments prepared in accordance with certain aspects of the present disclosure is much less than for a planar crystalline Ge film (no effective $Li^+$ capacity after only seven cycles), indicating the form factor of the as-electrodeposited Ge nanowires natively imparts stability against pulverization.

To gauge the overall performance quality of these Ge nanowire film electrodes prepared via certain methods of the present teachings, Table 1 summarizes the reported capacity benchmarks for related Ge materials as $Li^+$ battery anodes at 1 C and includes the results discussed above. As noted, $Li^+$ charge-discharge cycling studies are performed at 5 C rate on multiple Ge nanowire film electrodes. Galvanostatic $Li^+$ charge and discharge cycling for each electrode is shown below. The charge, discharge, and coulombic efficiencies for the $20^{th}$ cycle are collected in Table 1.

TABLE 1

Measured $Li^+$ Charge and Discharge Capacities for Ge Nanowire Film Electrodes[a]

| Sample | Charge capacity/ mA h $g^{-1}$ | Discharge capacity/ mA h $g^{-1}$ | Coulombic Efficiency |
|---|---|---|---|
| I | 733 | 713 | 0.973 |
| II | 936 | 902 | 0.964 |
| III | 804 | 782 | 0.973 |
| Average | | 800 ± 95[b] | |

[a]obtained at 5 C rate at 20th cycle for Ge samples deposited at −2.0 V for 1 hour.
[b]average ± 1σ.

The corrected charge and discharge capacity for the electrodeposited Ge nanowire film electrodes shown here have been adjusted slightly for mass and $Li^+$ capacity contributions from the residual In nanoparticles. As evident from Table 1, the discharge capacity at 1 C for the Ge nanowires prepared here via certain aspects of the inventive technology compare favorably with other Ge nanomaterials, approximately 160% larger than the previous reported capacity of Ge nanowire film electrodes prepared through high temperature VLS. Only two reports have shown Ge nanomaterials with markedly larger discharge capacities after 20 cycles, achieved by coating with a carbon/graphitic surface layer for stability. A comparison of those data and the responses shown here show that the discharge capacities at the initial cycles are nominally equivalent. It is believed that the polycrystalline nature of these Ge nanowires, particularly the randomized orientation of the crystallites along the nanowire long axis, which presents lattice planes favorable for Li+ insertion, which is believed to be the likely source for the high capacities demonstrated.

Although no additional measures are taken to stabilize and/or augment the native $Li_+$ capacities exhibited by the as-prepared Ge nanowires, previously described conventional coating strategies are contemplated to be used with the inventive materials to impart additional stability. Moreover, the Ge nanowire film electrodes investigated are merely exemplary and were not rigorously optimized in terms of nanowire diameter, density, or length. It is believed that further refinements in these parameters will lead to further improved performance characteristics. Further, the activity of these Ge nanowire film electrodes formed by certain methods of the present disclosure are highly reproducible. Cycling data recorded at a faster charge-discharge rate (5 C) for several separately electrodeposited Ge nanowire film electrodes demonstrates that capacity values vary by less than 12% between different electrodeposited Ge nanowire film electrodes.

The cumulative data indicate that materials formed in accordance with certain aspects of the present technology are viable and provide a simple strategy for directly producing functional semiconductor (Ge) nanowire electrodes for energy conversion devices. These results highlight several advantages that the inventive techniques have over both VLS and SLS strategies, as well as alternative physical-template-based electrochemical nanowire syntheses for this purpose. Both VLS and SLS routes for Ge nanowire growth require high (>300° C.) temperatures. Physical-template-based electrochemical strategies similarly require a high temperature annealing step to effect an amorphous to crystalline transition. The data here illustrate that nanowires are crystalline when prepared through methods according to the present teachings and do not require subsequent annealing. Both VLS and SLS methods as well as physical-template-based electrochemical methods require high energy density, partially reduced chemical precursors, such as $GeH_4$, $GeCl_4$, $GeI_2$ or diphenylgermane. As embodied here, certain processes according to the present teachings for forming Ge nanowires use a less expensive fully oxidized precursor ($GeO_2$) as the feedstock. For the purposes of making electrodes, VLS requires growing nanowires on a substrate that can withstand high temperatures, while SLS requires separate processing steps for collecting and attaching nanowires to a current collector. As shown here, the inventive processes yield crystalline Ge nanowires directly on a variety of conductive substrates. VLS, SLS, and traditional electrochemical synthetic strategies do not tolerate the presence of water. For Ge nanowires, the results show processes according to certain aspects of the inventive processes can be readily performed in a liquid aqueous electrolyte, which does not have to be either caustic or highly acidic. As noted above, other polar solvents that dissolve germanium oxide may also be employed in addition to or instead of water in the electrolyte. Template-based electrochemical methods require a hard, physical mold to define particular nanostructured morphologies. No physical or chemical (e.g., surfactants) templates are needed however to control nanowire diameters or densities with the inventive processes.

The cumulative data show that the processes according to certain aspects the present teachings for forming crystalline Ge previously observed at liquid Hg electrodes, also occurs at small, discrete In nanoparticles supported on either n-type silicon (Si) or copper (Cu) electrode substrates. The presented results indicate that the size and density of the crystalline Ge nanowires are readily tunable through control of the parent In nanoparticles and that each electrodeposited Ge nanowire is in direct electrical contact with the underlying electrode support through the In nanoparticle at the base of each nanowire. The activity of the as-prepared Ge nanowire film electrodes was competitive with existing, alternative protocols for producing nanostructured Ge battery anodes, with the important caveats that the method developed here was simpler, less energy-intensive, and was performed entirely under bench top conditions. Overall, the processes according to the present teachings show ability to directly prepare a functional, high-activity nanomaterials-based device component. The dataset shown in the examples shows simple processes that make fully functional energy-conversion technologies entirely through bench top chemistry and electrochemistry.

The inventive processes provide several unique advantages for the preparation of crystalline semiconductors, such as germanium (Ge) nanomaterials. The electrodeposited semiconductor materials are crystalline as-prepared at room temperature, bypassing the need for annealing. Further, an oxide compound, such as $GeO_2$ can be used as the source materials for semiconductor nanowires. Lastly, nanostructures, such as nanowires, with tunable morphologies can be prepared without any physical or chemical templating agent. Thus, the present teachings provide facile and direct methods of production.

In accordance with certain aspects of the present disclosure, methods are provided to form materials that comprise a semiconductor element (e.g., an element found in Group IV of the Periodic Table), including crystalline materials comprising the semiconductor element. In certain aspects, a material that comprises a semiconductor element is formed by first contacting an electrolyte with a first electrode. The electrolyte may be aqueous comprising water or may comprise one or more polar solvents. The first electrode is in electrical communication with a second electrode having a second opposite polarity from the first electrode, so that an electrolytic process is conducted. The electrolyte can be formed by combining water, optionally one or more polar compounds, and an oxide compound of a semiconductor element.

Thus, in certain aspects, the present teachings provide a method that comprises contacting an electrolyte with a first electrode, wherein the first electrode is in electrical communication with a second electrode having a second opposite polarity from the first electrode. The electrolyte may be aqueous comprising water or may comprise one or more polar solvents. An aqueous electrolyte is formed by combining water and an oxide compound of a semiconductor element selected from the group consisting of: silicon, germanium, or combinations thereof. In certain alternative variations, the electrolyte may comprise one or more polar solvents, so that an electrolyte is formed by combining the one or more polar solvents with an oxide compound of a semiconductor element selected from the group consisting of: silicon, germanium, or combinations thereof. A precipitated solid material comprising the semiconductor element is generated by applying an electric potential to the first electrode in contact with the electrolyte to drive an electrochemical reduction reaction that forms a solid material comprising the semiconductor element by precipitation out of solution at or within the first electrode. In certain variations, the solid material is crystalline and comprises silicon and the first electrode comprises a material that is inactive with respect to any parasitic electrolyte decomposition electrochemical reaction in the presence of the semiconductor element. In certain variations, the oxide compound comprises silicon dioxide ($SiO_2$) and the first electrode comprises mercury or indium, so as to form the crystalline solid material. In certain other variations, the solid material optionally comprises silicon and the generating occurs by dissolving the silicon into the first electrode, followed by saturating the first electrode with the dissolved silicon, and then precipitating the silicon from the first electrode. In yet other variations, the solid material comprises germanium and the first electrode comprises a material that is inactive with respect to any parasitic electrolyte decomposition electrochemical reaction in the presence of the semiconductor element, so that the generating occurs by dissolving the germanium in the first electrode, followed by saturating the first electrode with the dissolved germanium, and then precipitating the germanium from the first electrode. The oxide compound optionally comprises germanium oxide ($GeO_2$) and the first electrode comprises mercury or indium, so as to form a solid material. In certain aspects, the rate of generating the precipitated solid material comprising the semiconductor element is determined by magnitude of the applied electric potential. In other aspects, the rate of generating of the precipitated solid material comprising the semiconductor element is greater than or equal to about $1 \times 10^{-12}$ mol cm$^{-2}$ s$^{-1}$. In certain other aspects, the applied electric potential is greater than or equal to about a standard potential for the semiconductor reduction process to less than or equal to about 2 V overpotential. In certain aspects, the first electrode comprises a metal selected from the group consisting of: mercury, gallium, indium, and alloys and combinations thereof. The generating may optionally be conducted at greater than or equal to room temperature to less than or equal to about 100° C.

In certain other variations, methods are provided for forming a crystalline material that comprises contacting an electrolyte with a first liquid electrode, wherein the first liquid electrode is in electrical communication with a second electrode having a second opposite polarity from the first electrode. The electrolyte may be aqueous comprising water or may comprise one or more polar solvents. An aqueous electrolyte is optionally formed by combining water and an oxide compound comprising a Group IV semiconductor element In certain alternative variations, the electrolyte may comprise one or more polar solvents, so that an electrolyte is formed by combining the one or more polar solvents with an oxide compound comprising a Group IV semiconductor element. The first liquid electrode comprises a metal selected from the group consisting of: mercury, gallium, indium, zinc, cadmium, combinations and alloys thereof. The method comprises generating a crystalline material comprising the Group IV semiconductor element by applying an electric potential to the first liquid electrode in contact with the electrolyte to drive an electrochemical reduction reaction that generates the crystalline material comprising the Group IV semiconductor element by precipitation at or within the first liquid electrode. In certain variations, the generating occurs by dissolving the Group IV semiconductor element in the first liquid electrode, followed by saturation of the first liquid electrode with the Group IV semiconductor element, and then precipitating the Group IV semiconductor element from the first liquid electrode. In certain variations, the Group IV semiconductor element is selected from the group consisting of: germanium, silicon, and combinations thereof. In other variations, the oxide compound of the electrolyte is selected from either germanium oxide ($GeO_2$) or silicon dioxide ($SiO_2$). The crystalline material may be a polycrystalline material in certain embodiments. In certain variations, the polycrystalline material has an average crystal domain size of greater than or equal to about 10 nanometers or less than or equal to about 500 micrometers, where the crystal domains are randomly oriented. In other variations, the crystalline material is optionally a single crystal material. In yet other aspects, the methods may further comprise controlling the morphology of the crystalline material by the applied electric potential applied to generate a polycrystalline material selectively in the shape of filaments, cubes, or sheets.

In yet other aspects, a polycrystalline material is provided by the present teachings. For example, in certain variations, the polycrystalline material comprises a precipitated solid comprising a semiconductor element selected from the group consisting of: silicon, germanium, or combinations thereof having randomly oriented crystal domains. An average crystal domain size is optionally greater than or equal to about 5 nm. In certain variations, an average crystal domain size is optionally greater than or equal to about 5 nm to less than or equal to about 10 micrometers. In certain variations, the polycrystalline material is in the form of a filament, a cube, or a sheet. In certain embodiments, an electrochemical cell comprising an electrode comprising the polycrystalline material is contemplated, by way of non-limiting example. The semiconductor element optionally comprises germanium and may be in the form of a filament (e.g., a nanowire).

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A method comprising:
   contacting a liquid electrolyte with a first liquid electrode, wherein the first liquid electrode is in electrical communication with a second electrode having a second opposite polarity from the first liquid electrode, wherein the liquid electrolyte is formed by combining water and an oxide compound of a semiconductor element selected from the group consisting of: silicon, germanium, and combinations thereof, and wherein the first liquid electrode comprises a metal selected from the group consisting of: mercury, gallium, indium, zinc, cadmium, combinations and alloys thereof; and
   generating a precipitated crystalline solid material comprising the semiconductor element by applying an electric potential to the first liquid electrode in contact with the electrolyte to drive an electrochemical reduction reaction that forms a solid material comprising the semiconductor element by precipitation out of solution at or within the first liquid electrode.

2. The method of claim 1, wherein the solid material is crystalline and comprises silicon and the first liquid electrode comprises a material that is inactive with respect to any parasitic electrolyte decomposition electrochemical reaction in the presence of the semiconductor element.

3. The method of claim 2, wherein the oxide compound comprises silicon dioxide ($SiO_2$) and the first liquid electrode comprises mercury or indium, so as to form the crystalline solid material.

4. The method of claim 1, wherein the solid material comprises silicon and the generating occurs by dissolving the silicon into the first liquid electrode, followed by saturating the first liquid electrode with the dissolved silicon, and then precipitating the silicon from the first liquid electrode.

5. The method of claim 1, wherein the solid material comprises germanium and the first liquid electrode comprises a material that is inactive with respect to any parasitic electrolyte decomposition electrochemical reaction in the presence of the semiconductor element, so that the generating occurs by dissolving the germanium in the first liquid electrode, followed by saturating the first liquid electrode with the dissolved germanium, and then precipitating the germanium from the first liquid electrode.

6. The method of claim 5, wherein the oxide compound comprises germanium oxide ($GeO_2$) and the first liquid electrode comprises mercury or indium.

7. The method of claim 1, wherein the rate of generating the precipitated solid material comprising the semiconductor element is determined by magnitude of the applied electric potential.

8. The method of claim 1, wherein the rate of generating the precipitated solid material comprising the semiconductor element is greater than or equal to about $1 \times 10^{-12}$ mol $cm^{-2}$ $s^{-1}$.

9. The method of claim 1, wherein the applied electric potential is greater than or equal to about a standard potential for the semiconductor reduction process to less than or equal to about 2 V overpotential.

10. The method of claim 1, wherein the first liquid electrode comprises a metal selected from the group consisting of: mercury, gallium, indium, alloys and combinations thereof.

11. The method of claim 1, wherein the generating is conducted at greater than or equal to room temperature to less than or equal to about 100° C.

12. A method for forming a crystalline material comprising:
   contacting a liquid electrolyte with a first liquid electrode, wherein the first liquid electrode is in electrical communication with a second electrode having a second opposite polarity from the first liquid electrode, wherein the liquid electrolyte is formed by combining water and an oxide compound comprising a Group IV semiconductor element, and wherein the first liquid electrode comprises a metal selected from the group consisting of: mercury, gallium, indium, zinc, cadmium, combinations and alloys thereof; and
   generating a crystalline material comprising the Group IV semiconductor element by applying an electric potential to the first liquid electrode in contact with the electrolyte to drive an electrochemical reduction reaction that generates the crystalline material comprising the Group IV semiconductor element by precipitation at or within the first liquid electrode.

13. The method of claim 12, wherein the generating occurs by dissolving the Group IV semiconductor element in the first liquid electrode, followed by saturation of the first liquid electrode with the Group IV semiconductor element, and then precipitating the Group IV semiconductor element from the first liquid electrode.

14. The method of claim 12, wherein the Group IV semiconductor element is selected from the group consisting of: germanium, silicon, and combinations thereof.

15. The method of claim 12, wherein the oxide compound is selected from either germanium oxide ($GeO_2$) or silicon dioxide ($SiO_2$).

16. The method of claim 12, wherein the crystalline material is a polycrystalline material.

17. The method of claim 16, wherein the polycrystalline material has an average crystal domain size of greater than or equal to about 10 nanometers to less than or equal to about 500 micrometers, wherein domains in the polycrystalline material are randomly oriented.

18. The method of claim 12, wherein the crystalline material is a single crystal material.

19. The method of claim 12, further comprising controlling the morphology of the crystalline material by the applied electric potential applied to generate a polycrystalline material in the shape of filaments, cubes, or sheets.

* * * * *